(12) United States Patent
Kenney et al.

(10) Patent No.: US 10,249,470 B2
(45) Date of Patent: Apr. 2, 2019

(54) SYMMETRICAL INDUCTIVELY COUPLED PLASMA SOURCE WITH COAXIAL RF FEED AND COAXIAL SHIELDING

(71) Applicant: APPLIED MATERIALS, INC., Santa Clara, CA (US)

(72) Inventors: Jason A. Kenney, Sunnyvale, CA (US); James D. Carducci, Sunnyvale, CA (US); Kenneth S. Collins, San Jose, CA (US); Richard Fovell, San Jose, CA (US); Kartik Ramaswamy, San Jose, CA (US); Shahid Rauf, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 555 days.

(21) Appl. No.: 13/897,585

(22) Filed: May 20, 2013

(65) Prior Publication Data

US 2014/0020838 A1 Jan. 23, 2014

Related U.S. Application Data

(63) Continuation-in-part of application No. 13/666,224, filed on Nov. 1, 2012, and a continuation-in-part of
(Continued)

(51) Int. Cl.
| | |
|---|---|
| *C23C 16/00* | (2006.01) |
| *H01L 21/306* | (2006.01) |
| *H01J 37/04* | (2006.01) |
| *H01J 37/32* | (2006.01) |
| *H05H 1/46* | (2006.01) |

(52) U.S. Cl.
CPC .......... *H01J 37/04* (2013.01); *H01J 37/321* (2013.01); *H01J 37/3211* (2013.01); *H05H 1/46* (2013.01); *H05H 2001/4667* (2013.01)

(58) Field of Classification Search
CPC .............. H01J 37/321; H01J 37/3211; H01J 37/32119; H01J 37/32128; H01J 37/32137; H01J 37/32146; H01J 37/32155; H01J 37/32165; H01J 37/32174; H01J 37/32183
USPC ...... 118/723 I, 723 IR, 723 AN; 156/345.48, 156/345.49; 315/111.51
See application file for complete search history.

(56) References Cited

U.S. PATENT DOCUMENTS

| | | | |
|---|---|---|---|
| 5,571,366 A | 11/1996 | Ishii et al. | |
| 5,620,523 A | 4/1997 | Maeda et al. | |

(Continued)

FOREIGN PATENT DOCUMENTS

| | | |
|---|---|---|
| JP | 2004-200429 A | 7/2004 |
| KR | 10-2004-0102300 A | 12/2004 |

(Continued)

OTHER PUBLICATIONS

Official Action dated Apr. 27, 2015 Issued in Co-Pending U.S. Appl. No. 13/666,614.
(Continued)

*Primary Examiner* — Luz L Alejandro Mulero
(74) *Attorney, Agent, or Firm* — Fish & Richardson P.C.

(57) ABSTRACT

A plasma reactor has an overhead multiple coil inductive plasma source with symmetric RF feeds and symmetrical RF shielding around the symmetric RF feeds.

13 Claims, 33 Drawing Sheets

Related U.S. Application Data application No. 13/666,245, filed on Nov. 1, 2012, and a continuation-in-part of application No. 13/666,280, filed on Nov. 1, 2012.

(60) Provisional application No. 61/673,937, filed on Jul. 20, 2012.

(56) References Cited

U.S. PATENT DOCUMENTS

| | | | |
|---|---|---|---|
| 5,792,272 | A | 8/1998 | van Os et al. |
| 5,897,713 | A * | 4/1999 | Tomioka ............... C23C 16/401 |
| | | | 118/723 I |
| 5,948,704 | A | 9/1999 | Benjamin et al. |
| 6,024,826 | A * | 2/2000 | Collins ............. H01J 37/32082 |
| | | | 118/723 E |
| 6,051,073 | A | 4/2000 | Chu et al. |
| 6,083,344 | A | 7/2000 | Hanawa et al. |
| 6,089,182 | A | 7/2000 | Hama |
| 6,129,808 | A | 10/2000 | Wicker et al. |
| 6,200,412 | B1 | 3/2001 | Kilgore et al. |
| 6,326,597 | B1 * | 12/2001 | Lubomirsky ..... H01L 21/67248 |
| | | | 118/723 R |
| 6,367,410 | B1 * | 4/2002 | Leahey ............. H01L 21/67103 |
| | | | 118/58 |
| 6,414,648 | B1 * | 7/2002 | Holland ................ H01J 37/321 |
| | | | 118/723 I |
| 6,450,117 | B1 | 9/2002 | Murugesh et al. |
| 6,451,161 | B1 | 9/2002 | Jeng et al. |
| 6,518,190 | B1 | 2/2003 | Lill et al. |
| 6,527,911 | B1 | 3/2003 | Yen et al. |
| 6,899,787 | B2 * | 5/2005 | Nakano ............. H01J 37/32183 |
| | | | 118/723 AN |
| 8,858,754 | B2 | 10/2014 | Horiguchi et al. |
| 8,933,628 | B2 | 1/2015 | Banna et al. |
| 2001/0019048 | A1 | 9/2001 | Ose et al. |
| 2002/0038791 | A1 | 4/2002 | Okumura et al. |
| 2002/0121345 | A1 | 9/2002 | Chen et al. |
| 2003/0213434 | A1 | 11/2003 | Gondhalekar et al. |
| 2004/0083971 | A1 | 5/2004 | Holland et al. |
| 2005/0257743 | A1 * | 11/2005 | Koshiishi .......... H01J 37/32082 |
| | | | 118/723 E |
| 2007/0023145 | A1 | 2/2007 | Bera et al. |
| 2009/0159425 | A1 | 6/2009 | Liu et al. |
| 2009/0250169 | A1 | 10/2009 | Carducci et al. |
| 2009/0294065 | A1 | 12/2009 | Lai et al. |
| 2011/0094996 | A1 | 4/2011 | Yamazawa et al. |
| 2012/0073756 | A1 | 3/2012 | Yamazawa |
| 2012/0090990 | A1 * | 4/2012 | Cox ........................ C23C 14/34 |
| | | | 204/298.04 |
| 2012/0248066 | A1 | 10/2012 | Yamazawa |
| 2013/0256271 | A1 | 10/2013 | Panagopoulos et al. |
| 2013/0278141 | A1 | 10/2013 | Dorf et al. |
| 2013/0278142 | A1 | 10/2013 | Dorf et al. |
| 2013/0284370 | A1 | 10/2013 | Collins et al. |
| 2015/0068682 | A1 | 3/2015 | Banna et al. |
| 2015/0087157 | A1 | 3/2015 | Aubuchon et al. |

FOREIGN PATENT DOCUMENTS

| | | |
|---|---|---|
| KR | 10-2009-0102257 A | 9/2009 |
| WO | WO-2008/088110 A1 | 7/2008 |

OTHER PUBLICATIONS

Official Action dated Feb. 10, 2016 Issued in Co-Pending U.S. Appl. No. 13/666,245.
Official Action dated Feb. 10, 2016 Issued in Co-Pending U.S. Appl. No. 13/897,592.
Official Action dated Feb. 10, 2016 Issued in Co-Pending U.S. Appl. No. 14/270,578.
U.S. Appl. No. 13/666,224, to Nguyen et al., filed Nov. 1, 2012.
U.S. Appl. No. 13/666,245, to Nguyen et al., filed Nov. 1, 2012.
U.S. Appl. No. 13/666,280, to Nguyen et al., filed Nov. 1, 2012.
U.S. Appl. No. 13/629,267, to Carducci et al., filed Sep. 27, 2012.
U.S. Appl. No. 13/897,592, to Kenney et al., filed May 20, 2013.
U.S. Appl. No. 13/966,614, to Carducci et al., filed Aug. 14, 2013.
U.S. Appl. No. 14/270,578, to Nguyen et al., filed May 6, 2014.
U.S. Appl. No. 14/294,431, to Kenney et al., filed Jun. 3, 2014.
U.S. Appl. No. 14/319,089, to Carducci et al., filed Jun. 3, 2014.

* cited by examiner

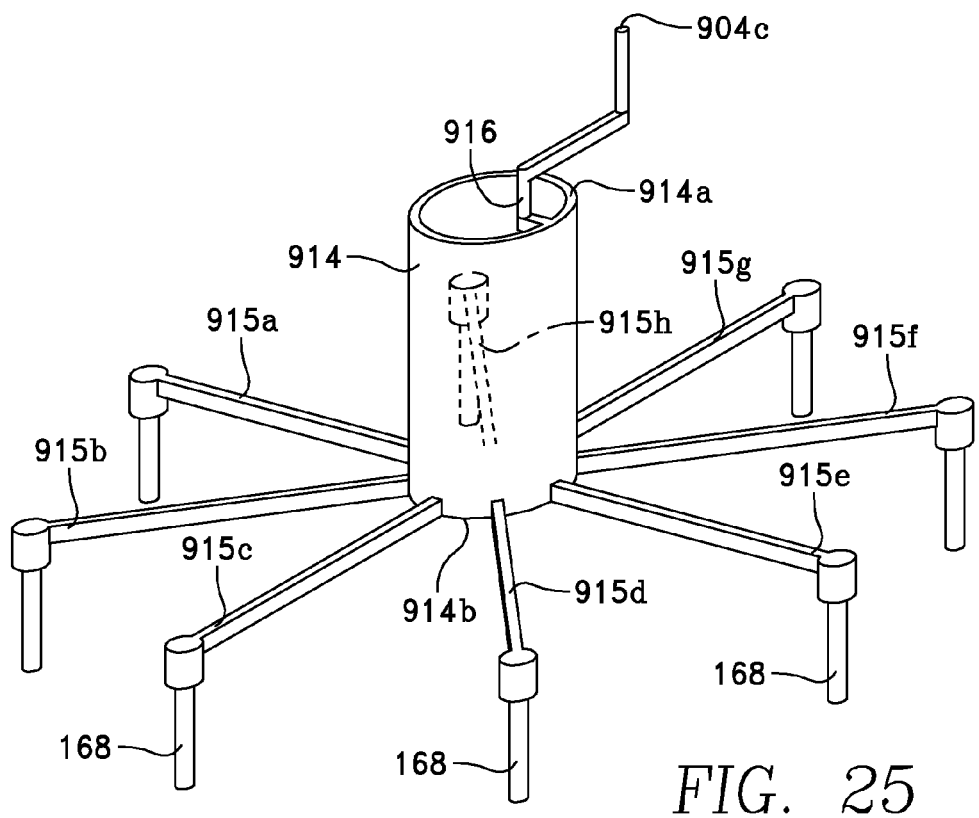
FIG. 25
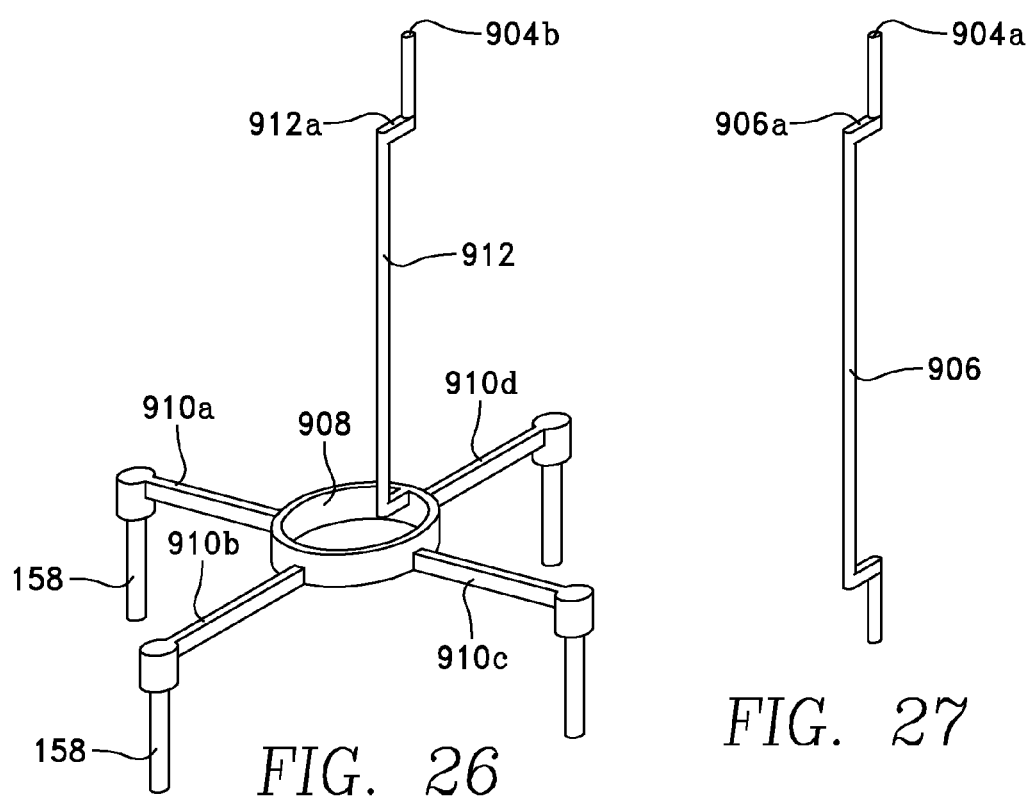
FIG. 26
FIG. 27

SYMMETRICAL INDUCTIVELY COUPLED PLASMA SOURCE WITH COAXIAL RF FEED AND COAXIAL SHIELDING

CROSS-REFERENCE TO RELATED APPLICATION

This application is a continuation-in-part of U.S. patent application Ser. No. 13/666,224 filed Nov. 1, 2012 entitled SYMMETRICAL INDUCTIVELY COUPLED PLASMA SOURCE WITH SYMMETRICAL FLOW CHAMBER by Andrew Nguyen, et al.; U.S. patent application Ser. No. 13/666,245 filed Nov. 1, 2012 entitled INDUCTIVELY COUPLED PLASMA SOURCE WITH PLURAL TOP COILS OVER A CEILING AND AN INDEPENDENT SIDE COIL, by Andrew Nguyen, et al.; and U.S. patent application Ser. No. 13/666,280 filed Nov. 1, 2012 entitled INDUCTIVELY COUPLED PLASMA SOURCE WITH MULTIPLE DIELECTRIC WINDOWS AND WINDOW-SUPPORTING STRUCTURE by Andrew Nguyen, et al., all applications which claim the benefit of U.S. Provisional Application Ser. No. 61/673,937 filed Jul. 20, 2012 entitled SYMMETRICAL MULTIPLE COAXIAL ICP SOURCE AND SYMMETRICAL FLOW CHAMBER, by Andrew Nguyen et al., and assigned to the present assignee. All of the above applications are hereby incorporated by reference in their entirety.

BACKGROUND

Field

Embodiments of the present invention are generally concerned with a plasma processing reactor chamber for processing workpieces, in which plasma is generated by inductive coupling of RF power to process gases inside the chamber.

Description of the Related Art

Electronic devices such as integrated circuits, flat panel displays and the like, are fabricated by a series of processes, in which thin film layers are deposited on substrates and etched into desired patterns. The process steps may include plasma-enhanced reactive ion etching (RIE), plasma-enhanced chemical vapor deposition (CVD), plasma-enhanced physical vapor deposition (PVD).

Uniform distribution of etch rate or deposition rate across the entire surface of the substrate is essential for successful fabrication. Such uniformity is becoming more difficult to achieve, as substrate size is increasing and device geometry is shrinking. In particular, inductively coupled plasma sources can have two concentrically arranged coil antennas over the chamber ceiling, so that uniformity of etch rate distribution can be optimized by adjusting the different RF power levels delivered to the different coil antennas. As workpiece diameter and chamber diameter increase, we have found this approach is not adequate, as the larger size increases the difficulty of attaining the requisite process uniformity. Various sources of process non-uniformity, such as chamber design asymmetries, temperature distribution non-uniformities and gas distribution control become more important.

SUMMARY

A plasma reactor comprises a window assembly adjacent a processing region, inner, middle and outer coil antennas adjacent the window assembly, and inner, middle and outer current distributors coupled to the inner, middle and outer coil antennas, respectively. A ceiling plate overlies the window assembly. First, second and third RF power terminals are disposed at the ceiling plate. First, second and third axial RF power feeds are connected between respective ones of the first, second and third RF power terminals and the inner, middle and outer current distributors. The third axial RF power feed comprises a hollow axial outer RF power distribution cylinder surrounding the first and second axial RF power feeds.

In one embodiment having coaxial symmetry, the second axial RF power feed comprises a hollow axial middle RF power distribution cylinder surrounding the first axial RF power feed. In a related embodiment, the first axial RF power feed comprises a center RF connection rod, and the center RF connection rod, the hollow middle RF power distribution cylinder and the outer RF distribution cylinder are coaxial. In a related embodiment, the inner, middle and outer coil antennas are coaxial with the center RF connection rod.

In one embodiment, the plasma reactor further comprises a plenum plate spaced from and below the ceiling plate and comprising a central opening. In a related embodiment, the outer RF distribution cylinder extends through the central opening with a gap between the plenum plate and the outer RF distribution cylinder, and a radial flange extends from the outer RF distribution cylinder and overlies the gap.

In one embodiment, the plasma reactor further comprises: (a) plural radial middle arms extending outwardly from the middle RF distribution cylinder and plural axial middle legs extending from the plural radial middle arms to spaced apart locations on the middle current distributor, and (b) plural radial outer arms extending outwardly from the outer RF distribution cylinder and plural axial outer legs extending from the plural radial outer arms to spaced apart locations on the outer current distributor.

In a related embodiment, a ground plate is provided below the plenum plate and above the middle current distributor, the plural axial middle legs extending through the ground plate. In one embodiment, the plural axial outer legs extend through the ground plate.

In a related embodiment, each one of the inner, middle and outer coil antennas comprises plural conductors having RF supply ends, and each one of the inner, middle and outer current distributors comprises an axially symmetric hollow body comprising a bottom facing the supply ends of the plural conductors of the corresponding one of the inner, middle and outer coil antennas.

In a further embodiment, the plasma reactor further comprises plural spaced-apart reactance elements connected between the plenum plate and the outer RF power distribution cylinder. In one embodiment, the reactance elements comprise discrete capacitors.

In a yet further embodiment, RF shielding is provided, comprising: (a) a hollow cylindrical inner shield between the center RF connection rod and the middle RF distribution cylinder, and (b) a hollow cylindrical upper shield between the middle RF distribution cylinder and the outer RF distribution cylinder, the upper shield comprising a bottom edge.

In one embodiment, the plenum plate is spaced from and below the ceiling plate and comprises a central opening, the upper shield extending through the central opening and defining an inner gap between the plenum plate and the upper shield. In a related embodiment, a skirt extends radially out from the upper shield near the bottom edge and overlies the inner gap.

In a related embodiment, the shielding further comprises: (a) a middle cylindrical shield extending axially from the plenum plate toward the ground plate and surrounding the plural axial middle legs, (b) a lower cylindrical shield extending downwardly from the ground plate, and (c) a bottom shield extending downwardly from the bottom edge of the lower cylindrical shield. In a related embodiment, a cylindrical base extends axially from the bottom shield, the cylindrical base surrounding the middle coil. In one embodiment, the bottom shield comprises a hollow truncated cone. In one embodiment, the shielding further comprises a floor encircled by the cylindrical base.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIG. 24A is a cross-sectional view along lines 24A-24A of FIG. 24.

FIG. 25 depicts the outer coil RF feed of FIG. 22.

FIG. 26 depicts the middle coil RF feed of FIG. 22.

FIG. 27 depicts the inner coil RF feed of FIG. 22.

Figure 1:
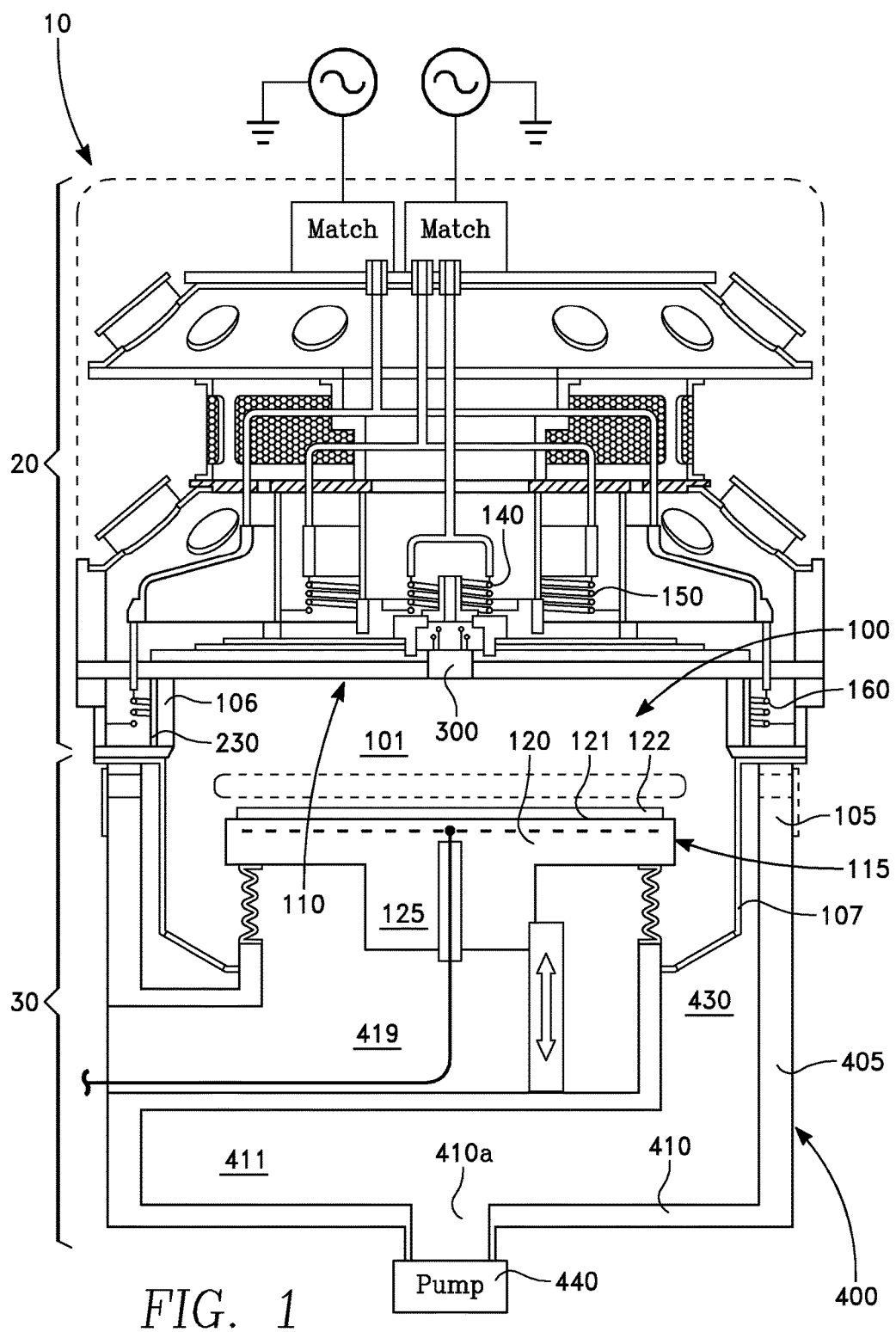
FIG. 1 is a cut-away view of a plasma reactor of an embodiment the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1A:
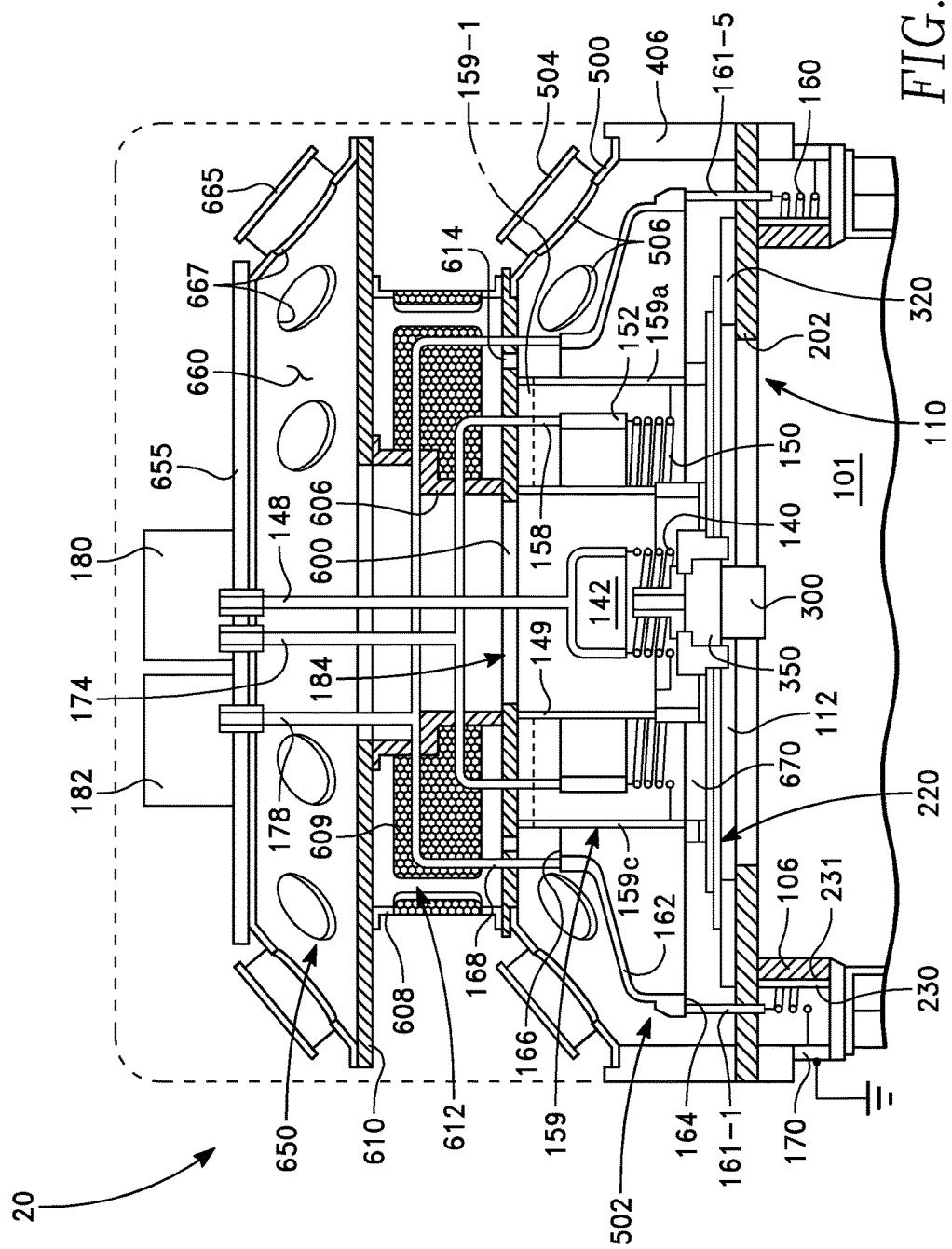
FIG. 1A is an enlarged view of an upper section of the reactor of FIG. 1.
Figure 1B:
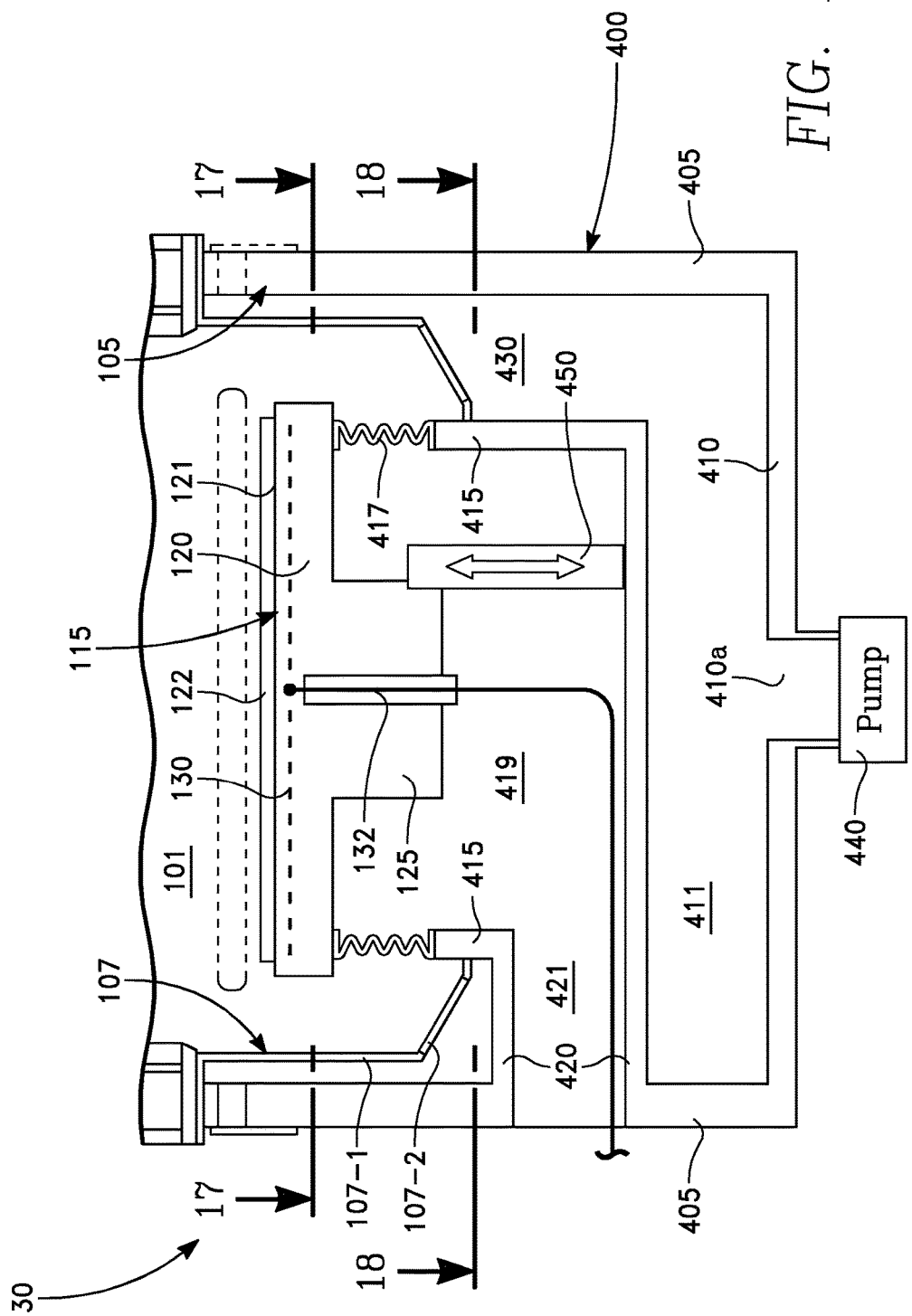
FIG. 1B is an enlarged view of a lower section of the reactor of FIG. 1.

A plasma reactor 10 depicted in FIG. 1 includes an upper portion 20 depicted in the enlarged view of FIG. 1A and a lower portion 30 depicted in the enlarged view of FIG. 1B. Referring to FIGS. 1, 1A and 1B, the plasma reactor 10 includes a plasma processing chamber 100 having a side wall 105 and a lid assembly 110. The side wall 105 has an axially symmetrical shape, such as a cylinder. The side wall 105 includes an axially symmetrical (e.g., cylindrical) dielectric side window 106 and a chamber liner 107, which may be formed of metal. A workpiece support 115 inside the chamber 100 includes a pedestal 120 having a workpiece support surface 121 facing the lid assembly 110 for holding a workpiece 122, and a post 125 supporting the pedestal 120. A processing region 101 of the chamber 100 is confined by the lid assembly 110, the pedestal 120 and the side wall 105. The pedestal 120 may include an insulated internal electrode 130. Optionally, an electrostatic chucking (ESC) voltage and/or RF plasma bias power may be supplied to the internal electrode 130 via a cable 132 extending through the post 125. The cable 132 may be coupled to an RF bias power source (such as an RF impedance matching network and/or an RF power generator) as an RF bias feed to the electrode 130. The cable 132 may be provided as a coaxial transmission line, which may be rigid (or flexible), or as a flexible coaxial cable.

Plasma source power is inductively coupled into the processing region 101 by a set of coil antennas, including an inner coil antenna 140, a middle coil antenna 150 and an outer or side coil antenna 160, all of which are concentrically disposed with respect to each other and are coaxial with the axis of symmetry of the side wall 105. The lid assembly 110 includes a disk-shaped dielectric window 112 through which the inner and middle coil antennas 140 and 150 inductively couple RF plasma source power into the processing region 101. The disk-shaped dielectric window 112 is coaxial with the side wall 105 and has a disk-plane parallel with the plane of the workpiece support surface 121. The side coil antenna 160 inductively couples RF plasma source power into the processing region 101 through the cylindrical dielectric side window 106. The dielectric windows 106 and 112 may be referred to collectively as a window assembly.

Figure 2:
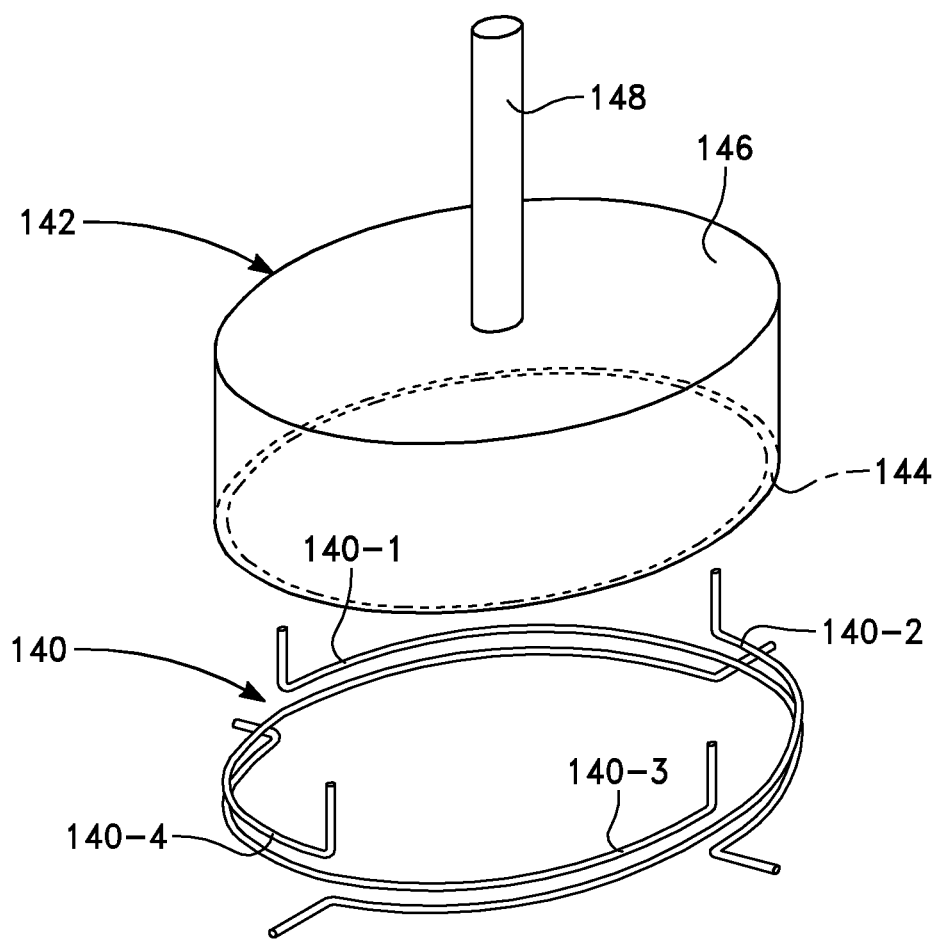
FIG. 2 illustrates an inner zone inductive RF power applicator of the reactor of FIG. 1.

Referring to FIGS. 1A and 2, in one embodiment, the inner coil antenna 140 includes four wire conductors 140-1 through 140-4, each one helically wound about a constant radius along an arc length of 180 degrees, their ends being staggered (i.e., offset along a circumferential direction) at uniformly spaced 90 degree intervals, as depicted in FIG. 2. Uniform and symmetrical distribution of RF power to the wire conductors 140-1 through 140-4 is provided by an RF current distributor in the form of an inverted metal bowl 142 having a circular bottom edge 144 contacting the top ends of each of the wire conductors 140-1 through 140-4, and a lid 146 connected to an inner RF feed rod 148. The bottom ends of the four wire conductors 140-1 through 140-4 are grounded by connection to an inner ground shield 149 (FIG. 1A) in the form of a cylindrical metal sleeve coaxial with the coil antenna 140 and lying between the inner and middle coil antennas 140 and 150. The inner ground shield 149 provides a uniform and symmetrical distribution of ground current from the four wire conductors 140-1 through 140-4, and further provides RF shielding or isolation between the inner and middle coil antennas 140 and 150, by suppressing mutual inductance between them. This enhances independent control of the inner and middle coil antennas 140, 150.

Figure 3:
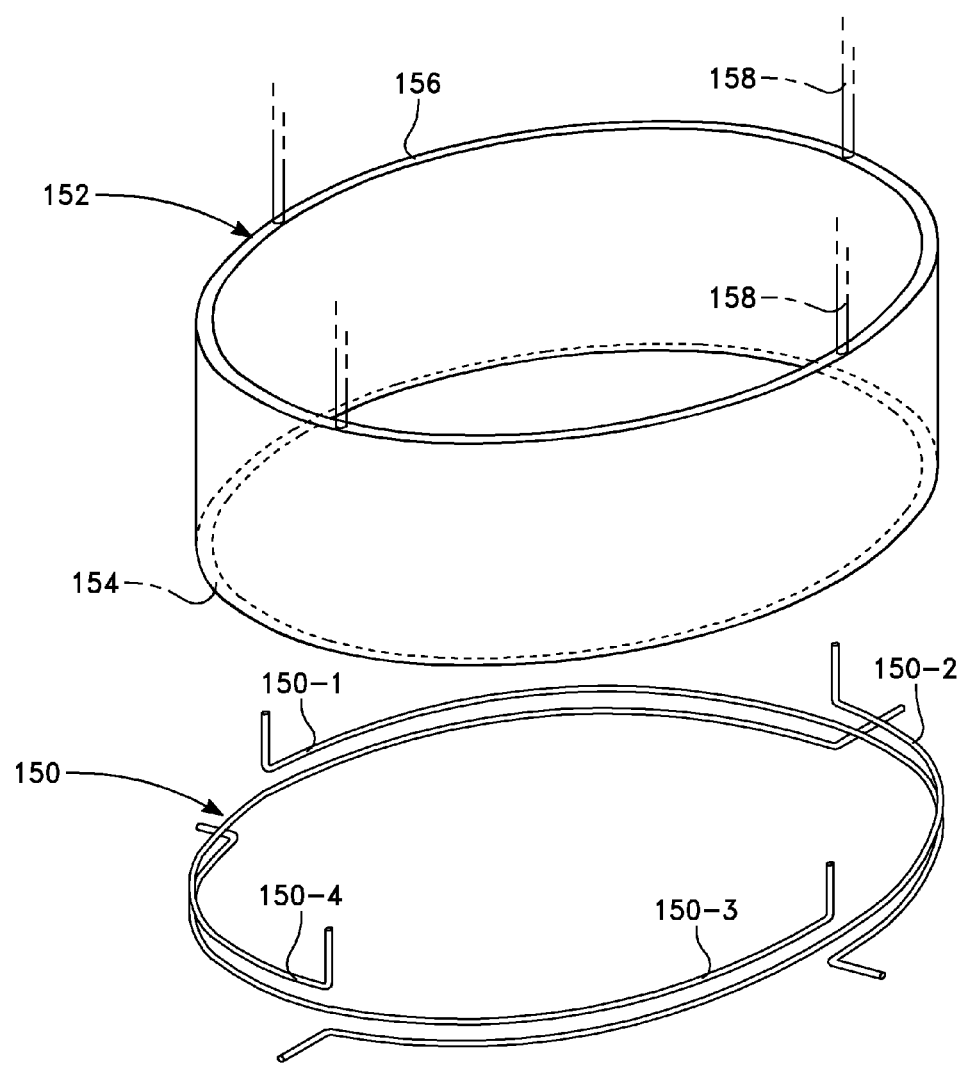
FIG. 3 illustrates an intermediate or middle zone inductive RF power applicator of the reactor of FIG. 1.

Referring to FIGS. 1A and 3, in one embodiment, the middle coil antenna 150 includes four wire conductors 150-1 through 150-4, each one helically wound about a constant radius along an arc length of 180 degrees, their ends being staggered at uniformly spaced 90 degree intervals, as depicted in FIG. 3. Uniform and symmetrical distribution of RF power to the wire conductors 150-1 through 150-4 is provided by an RF current distributor in the form of a cylindrical metal sleeve 152 having a circular bottom edge 154 contacting the top ends of each of the wire conductors 150-1 through 150-4, and a circular top edge 156 connected to a circular array of four axial RF feed rods 158. RF power is fed to the RF feed rods 158 by a conductor structure depicted in FIG. 5, which is described later in this specification.

Referring again to FIG. 1A, the bottom ends of the four wire conductors 150-1 through 150-4 are grounded by connection to a middle ground shield 159. The middle ground shield 159 may be in the form of a cylinder. However, in one embodiment depicted in dashed line in FIG. 1A, the top of the middle ground shield 159 is a metal ring 159-1 coaxial with the coil antenna 150. Four conductive legs 159a through 159d (of which only the legs 159a and 159c can be seen in the view of FIG. 1A) extend axially downward from the ring 159-1 and have bottom ends contacting the bottom ends of the four conductors 150-1 through 150-4. The middle ground shield 159 provides a uniform and symmetrical of ground current from the four wire conductors 150-1 through 150-4.

Figure 4:
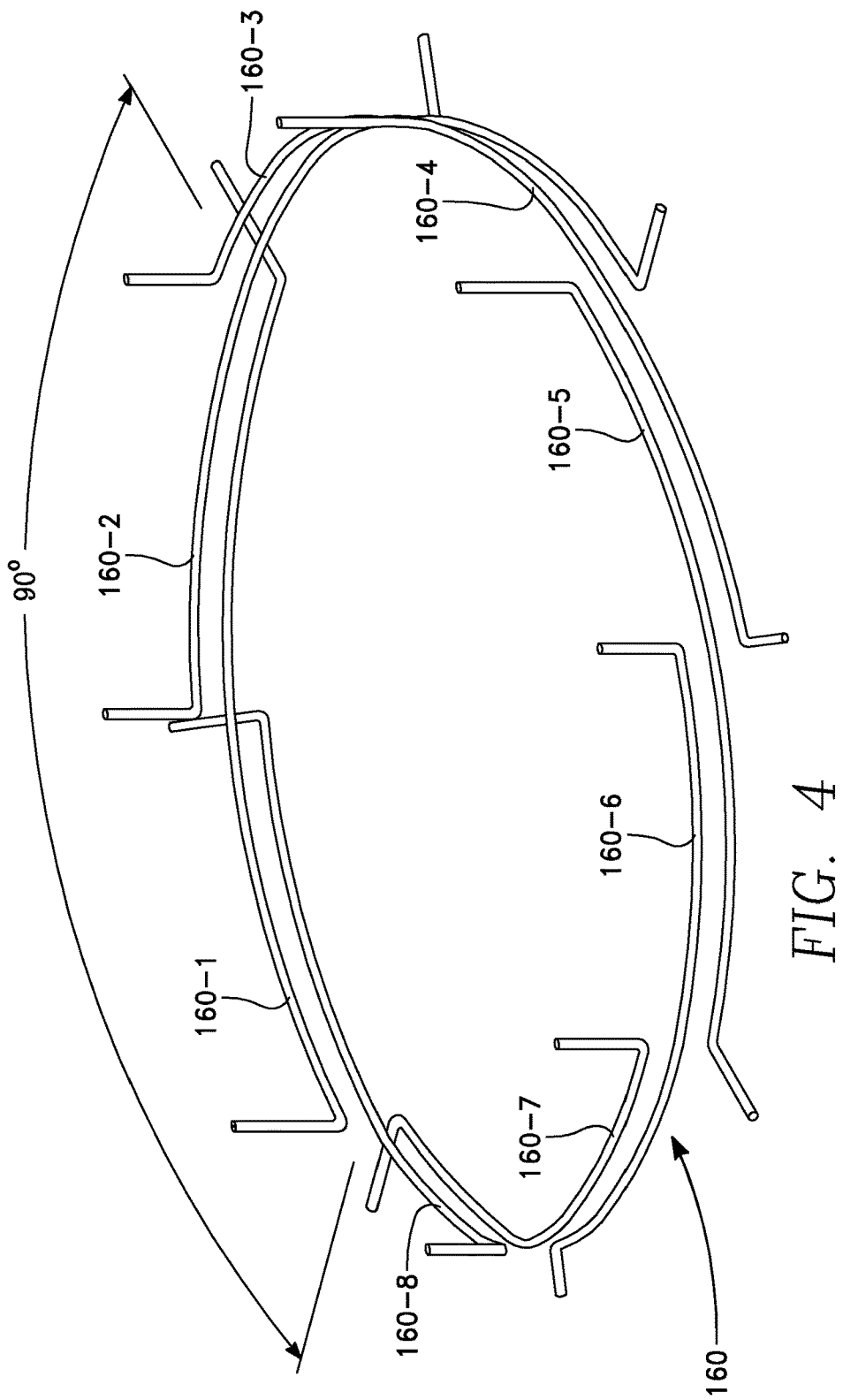
FIG. 4 illustrates an outer zone inductive RF power applicator of the reactor of FIG. 1.

Referring to FIGS. 1A and 4, the side coil antenna 160 is disposed below the plane of the disk shaped dielectric window 112 and surrounds the cylindrical dielectric side window 106. In one embodiment, the side coil antenna 160 includes eight wire conductors 160-1 through 160-8, each one helically wound about a constant radius along an arc length of 90 degrees, their ends being staggered at uniformly spaced 45 degree intervals, as depicted in FIG. 4. Uniform and symmetrical distribution of RF power to the wire conductors 160-1 through 160-8 is provided by an RF current distributor in the form of an inverted metal bowl 162 (FIG. 1A) having a circular bottom edge 164 attached to respective axial conductors 161-1 through 161-8 (of which only the axial conductors 161-1 and 161-5 are visible in the view of FIG. 1A) contacting the top ends of the wire conductors 160-1 through 160-8 respectively. The inverted metal bowl 162 further has a circular top edge 166 connected to a circular array of eight uniformly spaced axial RF feed rods 168. A cylindrical outer chamber wall 170 surrounds the side coil antenna 160 and is grounded. The bottom ends of the eight wire conductors 160-1 through 160-8 are grounded by connection to the outer chamber wall 170. While the described embodiments include direct connection to ground of the coil antennas 140, 150 and 160 by the ground shields 149 and 159 and the outer chamber wall 170, respectively, the connection to ground may not need to be a direct connection, and instead the connection to ground may be through elements such as capacitors, for example.

Figure 5:
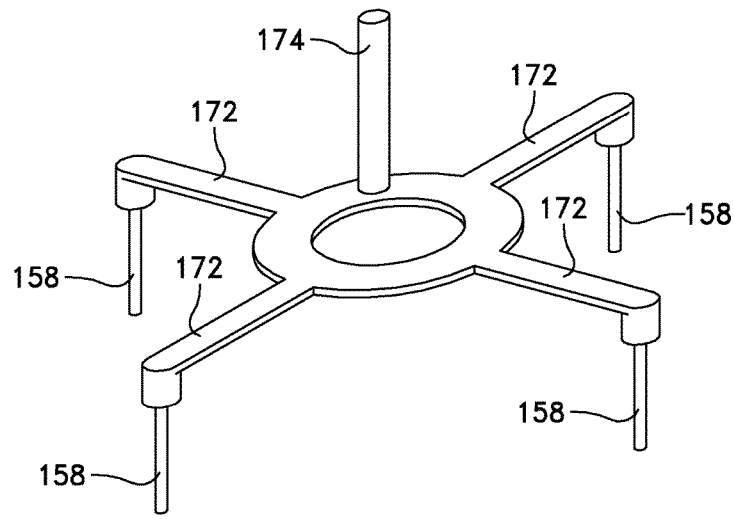
FIG. 5 illustrates a conductive RF power feeder for the RF power applicator of FIG. 3.
Figure 6:
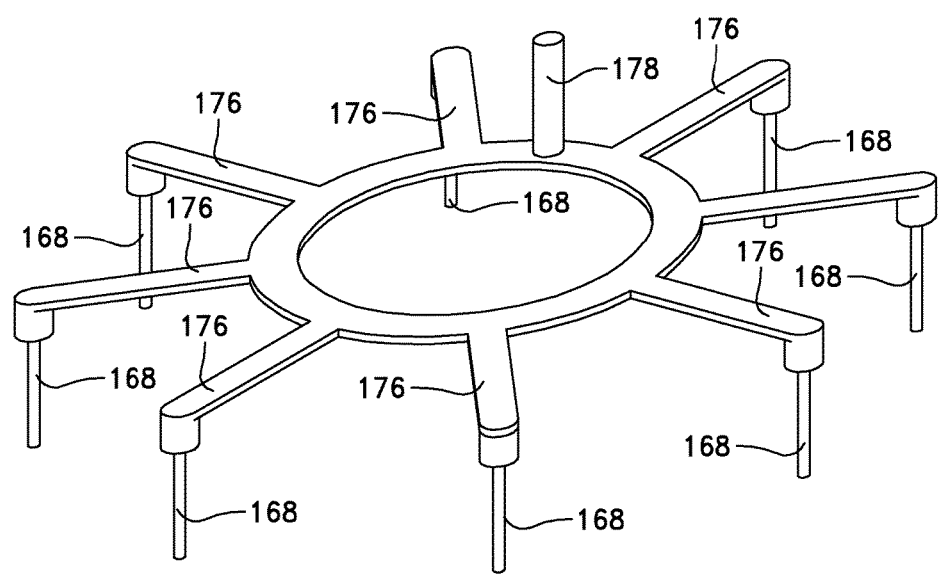
FIG. 6 illustrates a conductive RF power feeder for the RF power applicator of FIG. 4.

Referring to FIG. 5, the four axial RF feed rods 158 associated with the middle coil antenna 150 extend to four radial RF feed rods 172 connected to a common axial feed rod 174. Referring to FIG. 6, the eight axial RF feed rods 168 associated with the side coil antenna 160 extend to eight radial RF feed rods 176 connected to a common axial feed rod 178. The axial RF feed rod 148, the common axial feed rod 174 and the common axial feed rod 178 couple RF power to the respective coil antennas 140, 150 and 160. The power may be supplied from a common RF source or from different RF sources such as RF matches (RF impedance matching networks) 180 and 182. As will be described below with reference to FIG. 20B, an RF impedance matching network may be employed having dual outputs in order to drive two of the coil antennas with a first RF generator, while a second RF generator and a second RF impedance matching network drives the third coil antenna. Alternatively, as will be described below with reference to FIG. 20A, three RF generators may separately drive the three coil antennas through three respective RF impedance matching networks. In yet another embodiment, a single RF power generator may drive all three coil antennas through an RF impedance matching network having three outputs. In some implementations of the foregoing embodiments, the RF power levels applied to the different coil antennas may be separately adjusted in order to control radial distribution of plasma ion density. While described embodiments include the three coil antennas 140, 150 and 160, other embodiments may include only one or two of the three described coil antennas 140, 150 and 160.

Only the axial RF feed rod 148 is symmetrically located at the axis of symmetry of the side wall 105, while the axial feed rods 174 and 178 are located off-center, as depicted in FIGS. 1A, 5 and 6. This feature is asymmetrical. The axial RF feed rods 148, 158 and 168 are arrayed symmetrically relative to the axis of symmetry of the side wall 105. A generally disk-shaped conductive ground plate 184 generally parallel with the workpiece support surface 121 contains openings through which the axial RF feed rods 148, 158 and 168 extend. The ground plate 184 provides separation between an upper region containing the non-symmetrically arranged axial feed rods 174 and 178 (and an upper portion of the RF feed rod 148 which is symmetrically located), and a lower region containing only symmetrical features such as the axial RF feed rods 148, 158 and 168. The RF feed rods 148, 158 and 168 are electrically insulated from the ground plate 184. The ground plate 184 electromagnetically shields the processing region 101 from the effects of the asymmetric features above the ground plate 184 and also prevents skew effects in plasma processing of the workpiece 122.

Figure 7:
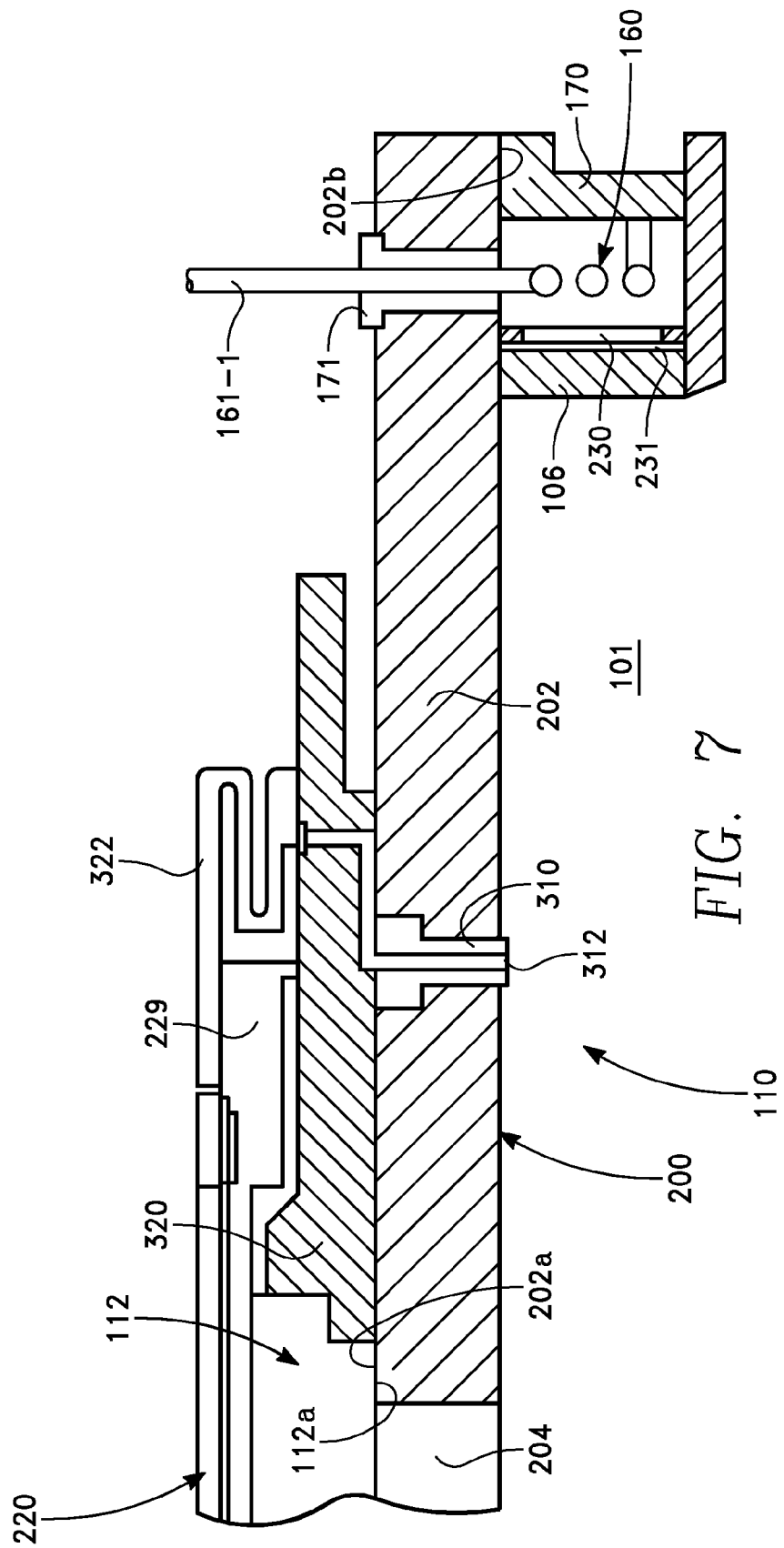
FIG. 7 is a cut-away cross-sectional view of a portion of a lid assembly of the reactor of FIG. 1.

Referring to FIGS. 1 and 7, the disk-shaped dielectric window 112 has a diameter less than the diameter of the outer chamber wall 170. The window 112 is supported at its periphery by an annular top gas plate 200 (described later in this specification) that spans the gap between the outer chamber wall 170 and the window 112, while maintaining the space below the window 112 free of structure that would otherwise inhibit inductive coupling of RF power into the processing region 101. The chamber diameter is therefore not limited by the diameter of the disk-shaped dielectric window 112. The inner and middle coil antennas 140 and 150 (coextensive with the disk-shaped dielectric window 112) may control plasma ion density distribution within an intermediate zone of a diameter smaller than that of the workpiece or wafer 122. Plasma density in an outer zone is governed by the side coil antenna 160 through the cylindrical dielectric window 106. This affords control of plasma ion density distribution across the entire wafer without requiring a concomitant increase in diameter of the disk-shaped dielectric window 112.

As referred to above, the annular top gas plate 200 supports the disk-shaped dielectric window 112 and spans the gap or distance between the outer chamber wall 170 and the periphery of the disk-shaped dielectric window 112. The top gas plate 200 includes an annulus 202 surrounding an opening 204. A top inner edge 202*a* of the annulus 202 underlies and supports an outer edge 112*a* of the dielectric window 112 and surrounds the opening 204. A bottom outer edge 202*b* of the annulus 202 rests on the outer chamber wall 170. The opening 204 faces the disk-shaped dielectric window 112. The axial conductors 161-1 through 161-8 (of the outer coil antenna 160) extend through respective insulators 171 in the top gas plate 200.

Figure 8:
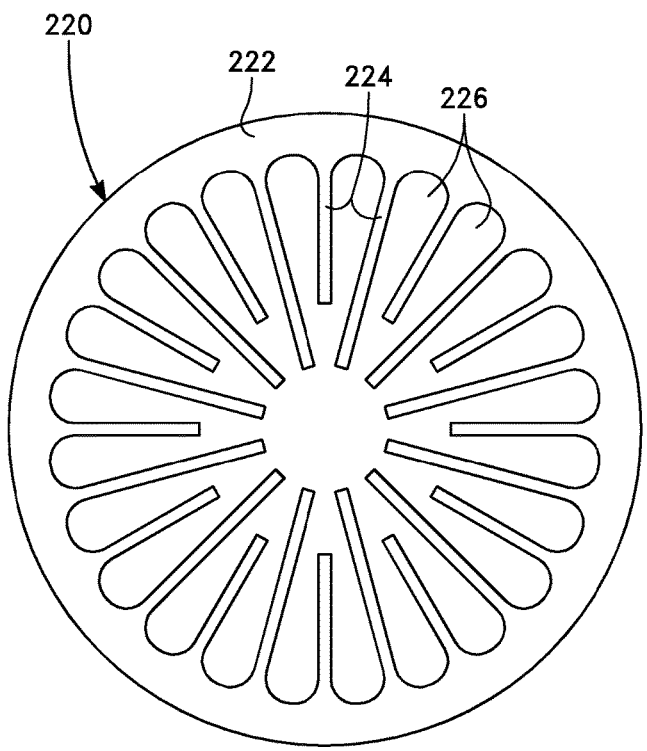
FIG. 8 is a plan view of a heater layer covering a disk-shaped dielectric window of the lid assembly of FIG. 7.

The disk-shaped dielectric window 112 and the cylindrical dielectric side window 106 are heated and have their respective temperatures controlled independently of one another. They are heated and cooled independently, by cooling from a fan system described later in this specification and by independent heater elements now described. A flat heater layer 220 depicted in FIGS. 1A, 7 and 8 overlies the disk-shaped dielectric window 112. The heater layer 220 is in the form of a disk-shaped Faraday shield, having an outer annulus 222 and plural radial fingers 224 extending radially inwardly from the outer annulus 222, the radial fingers 224 being separated from one another by evenly spaced apertures 226. The spacing of the radial fingers 224 (defining the width of the apertures 226) is sufficient to permit inductive coupling of RF power through the heater layer 220. The heater layer 220 is symmetrical with respect to the axis of the side wall 105. In the illustrated example, there are 24 radial fingers 224, although any suitable number of fingers may be employed. The heater layer 220 is heated electrically by an internal electrically resistive element 229 (FIG. 7) within the heater layer 220.

Figure 9:
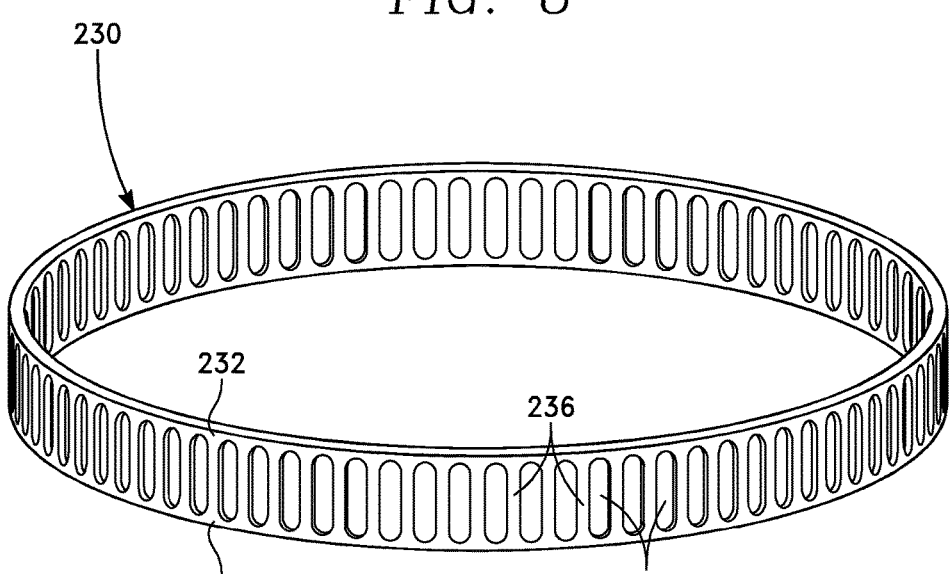
FIG. 9 is an orthographic projection of a heater layer covering a cylindrical dielectric window depicted with the lid assembly of FIG. 7.

A cylindrical Faraday shield layer 230 depicted in FIGS. 1A and 9 is disposed between the cylindrical dielectric window 106 and the outer coil antenna 160, and surrounds the cylindrical dielectric side window 106. The cylindrical Faraday shield layer 230 has upper and lower cylindrical rings 232, 234, and plural axial legs 236 extending axially between the upper and lower cylindrical rings 232, 234 and being separated by evenly spaced gaps 238. The cylindrical Faraday shield layer 230 may be heated electrically by an internal element (such as a heater layer 231 shown in FIGS. 1A and 7) within or contacting with the Faraday shield layer 230.

Process gas is injected into the processing region 101 by a central dual-zone ceiling gas injector 300 (FIG. 1A) and a circular array of peripheral (side) gas injectors 310 (FIG. 7). The ceiling gas injector 300 is located at the center of the disk-shaped dielectric window 112. The peripheral gas injectors 310 are supported on the top gas plate 200 near the side wall 106.

Figure 10:
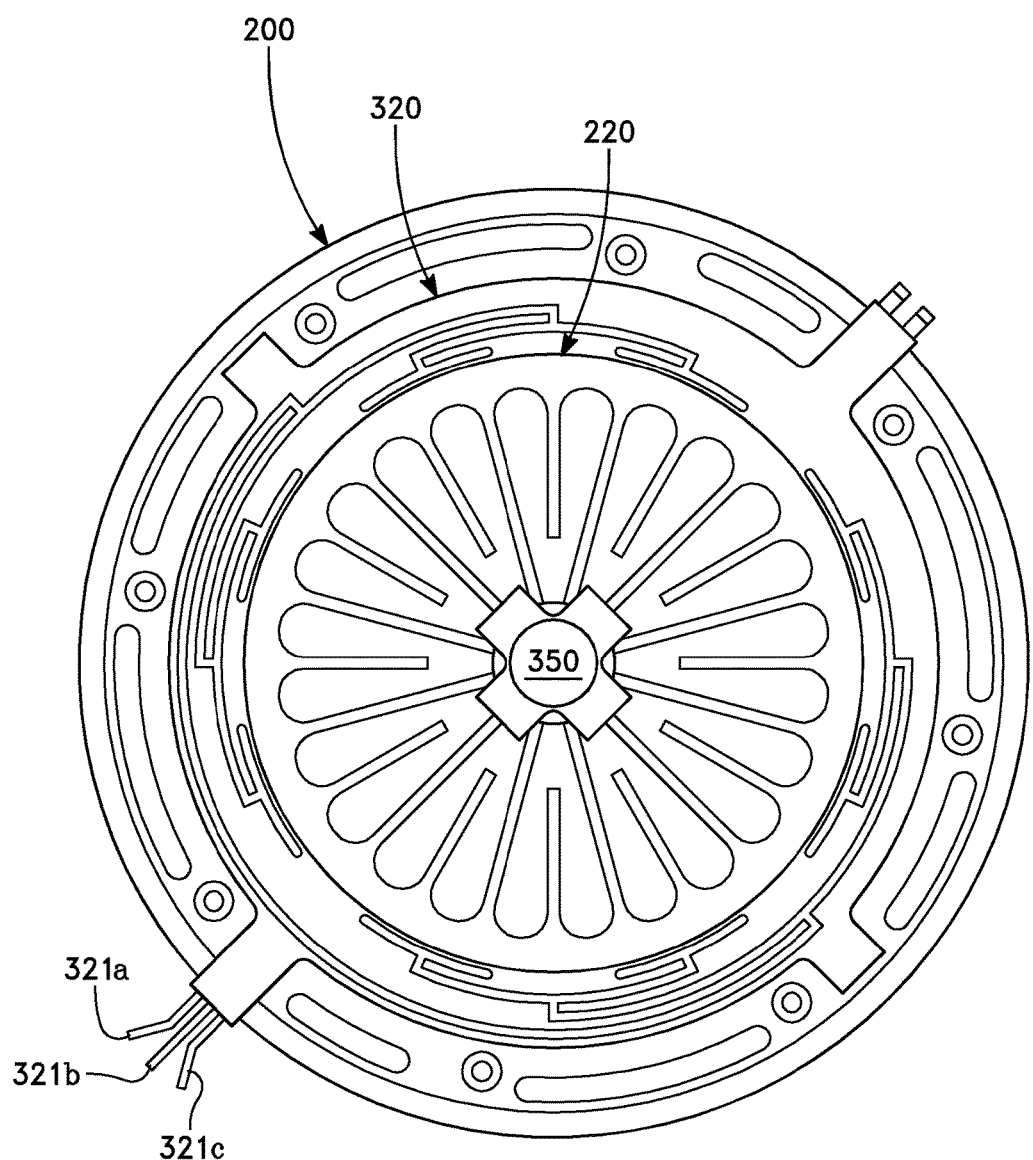
FIG. 10 is a plan view of the lid assembly of FIG. 7.
Figure 11A:
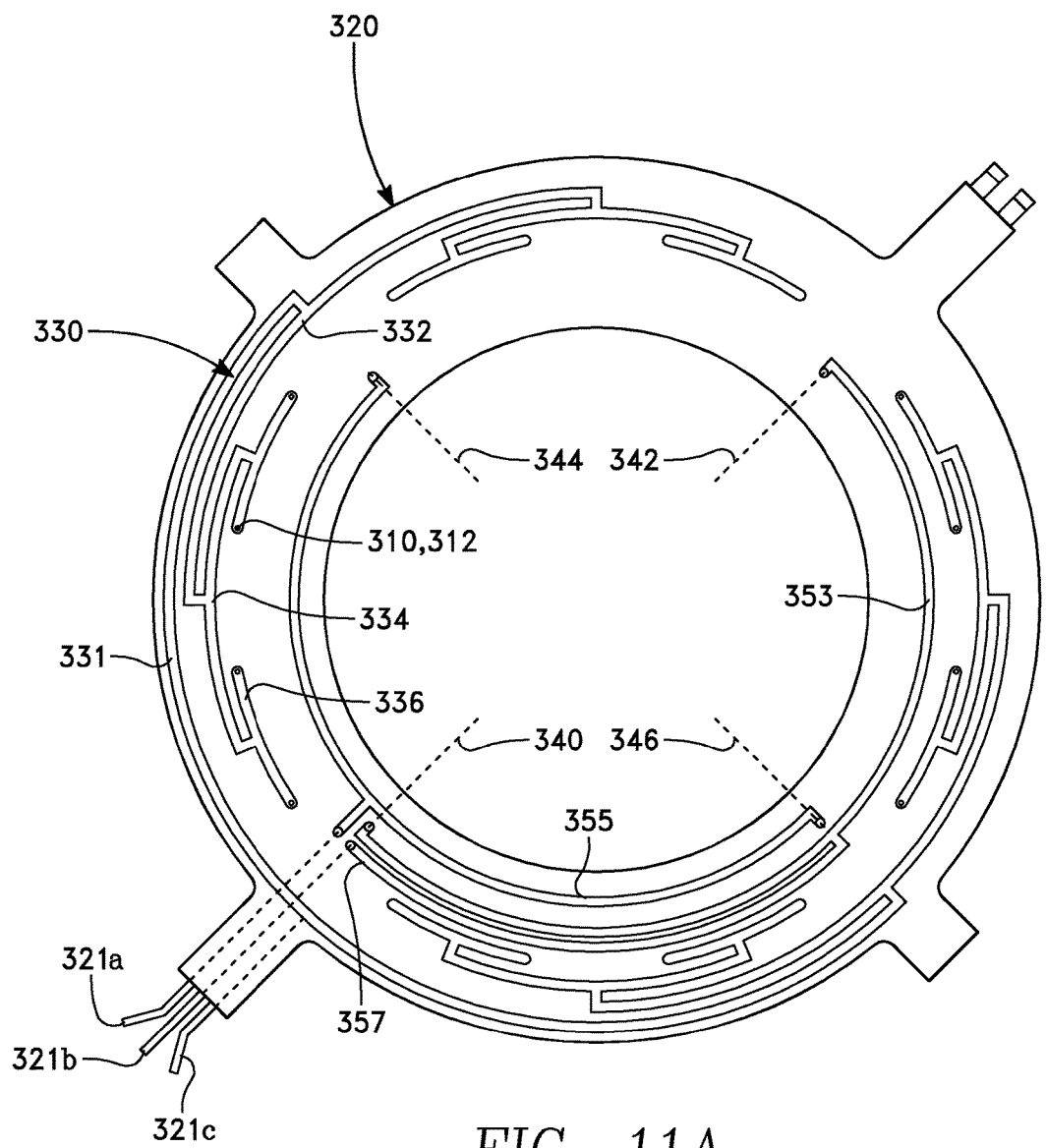
FIG. 11A is a plan view corresponding to FIG. 10 depicting gas flow passages in a gas flow plate of the lid assembly.

Referring to FIGS. 7, 10 and 11A, the lid assembly 110 includes an annular gas flow plate 320. The heater layer or Faraday shield 220 is held on the gas flow plate 320 by a spring plate 322 as shown in FIG. 7. The gas flow plate 320 has three gas input ports 321*a*, 321*b*, 321*c* (FIG. 10). The gas flow plate 320 provides recursive gas flow paths from the input port 321*a* to a first zone of the dual zone ceiling gas injector 300, recursive gas flow paths from the input port 321*b* to the other zone of the dual zone gas injector 300, and recursive gas flow paths from the gas input port 321*c* to the side gas injectors 310. The side gas injectors 310 are fed through respective gas ports 312 in the bottom surface of the gas flow plate 320 visible in the bottom view of FIG. 11B. The recursive gas flow paths provide uniformly distributed gas flow path lengths to different gas injection zones. Uniformity control of the gas distribution can also be enhanced by the recursive gas flow paths.

Referring to FIG. 11A, a first set or hierarchy of recursive gas flow paths 330 in the gas flow plate 320 feeds gas to the side gas injectors 310 through the gas ports 312. The first set of recursive gas flow paths 330 includes a half-circular gas flow path or channel 331. The gas injection port 321*c* is coupled to the midpoint of the half-circular gas flow channel 331. The gas flow path 331 extends around half a circle and feeds at its ends the midpoints of a pair of arcuate gas flow paths 332 each extending a quarter circle, which in turn feed at their respective ends the midpoints of four arcuate gas flow paths 334 each extending around an eighth circle. The four arcuate gas flow paths 334 feed at their ends the midpoints of eight arcuate gas flow paths 336 each extending around a sixteenth of a circle. The ends of the gas flow paths 336 feed the gas ports 312 for gas flow to the side gas injectors 310.

Figure 12:
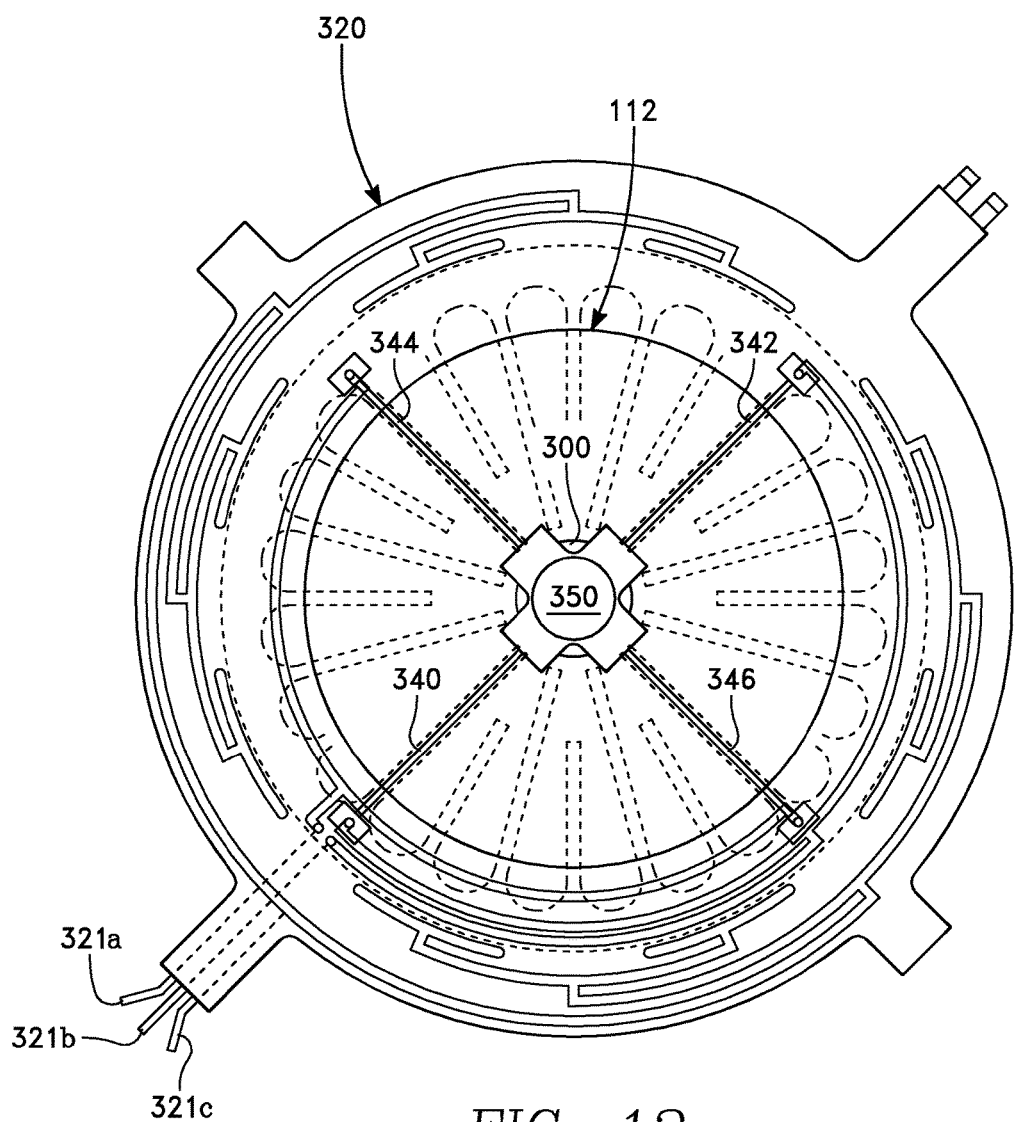
FIG. 12 is a plan view corresponding to FIG. 10 and depicting gas flow paths to a center hub.

Referring to FIG. 12, gas flow to one zone of the dual zone gas injector 300 is carried in a pair of opposing radial gas flow lines 340, 342 overlying the disk-shaped dielectric window 112. Gas flow to the other zone of the dual zone gas injector 300 is carried in a second pair of opposing radial gas flow lines 344, 346 overlying the disk-shaped dielectric window 112 and disposed at right angles to the first pair of radial gas flow lines 340, 342. Connection from the four radial gas flow lines 340, 342, 344, 346 to the dual zone gas injector 300 is provided by a gas flow hub 350 axially coupled to the dual zone gas injector 300.

Referring again to FIG. 11A, a half-circular gas flow channel 353 provides uniform distribution of gas flow from the gas input port 321b to the outer ends of the first pair of radial gas flow lines 340, 342. A quarter-circular gas flow channel 357 provides gas flow from the input port 321b to the midpoint of the half-circular gas flow channel 353. A half-circular gas flow channel 355 provides uniform gas flow from the gas input port 321a to the outer ends of the second pair of radial gas flow lines 344, 346.

Figure 12A:
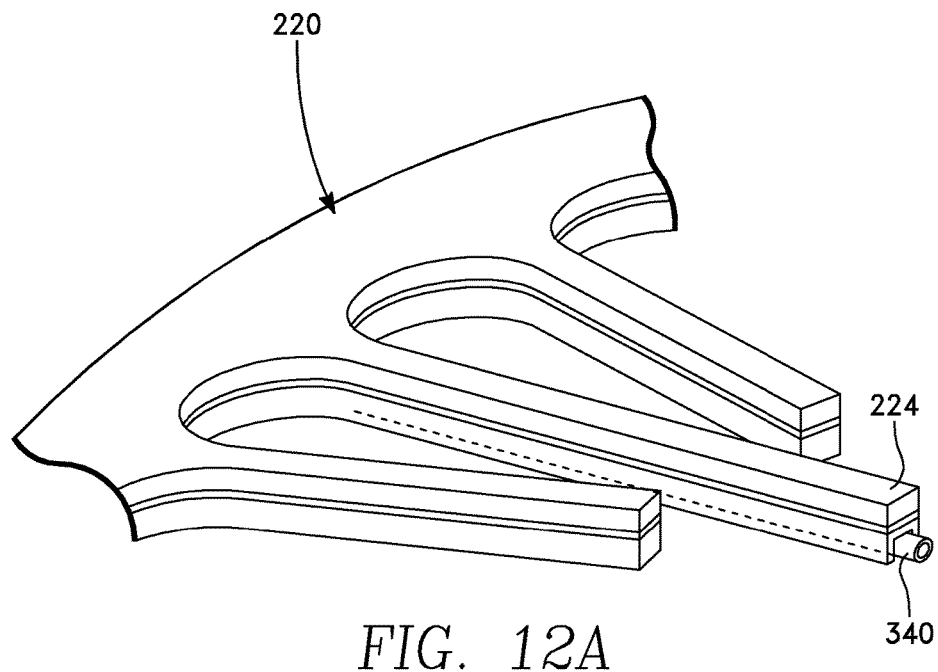
FIG. 12A is an orthographic projection corresponding to a portion of FIG. 12 depicting encasement of a gas flow conduit in a portion of the heater layer of FIG. 8.
Figure 12B:
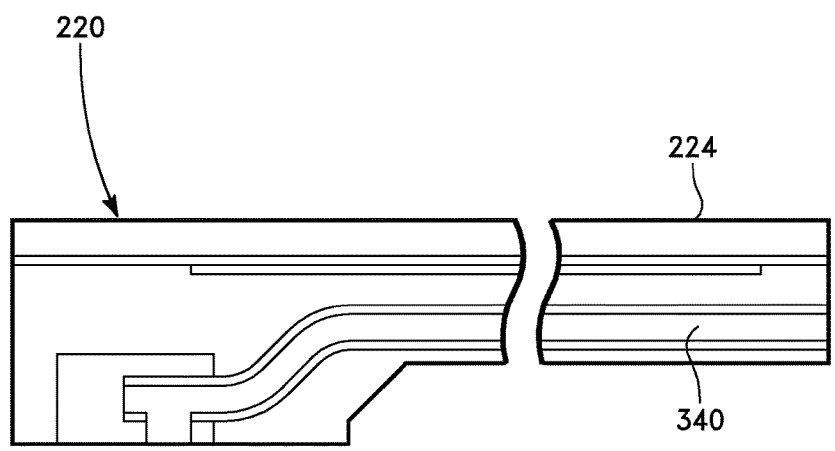
FIG. 12B is a cut-away elevational view corresponding to FIG. 12A.

As depicted in FIGS. 12, 12A and 12B, each of the four radial gas flow lines 340, 342, 344, 346 overlying the disk-shaped dielectric window 112 may be enclosed in a respective one of the radial fingers 224 of the heater layer 220.

Figure 13:
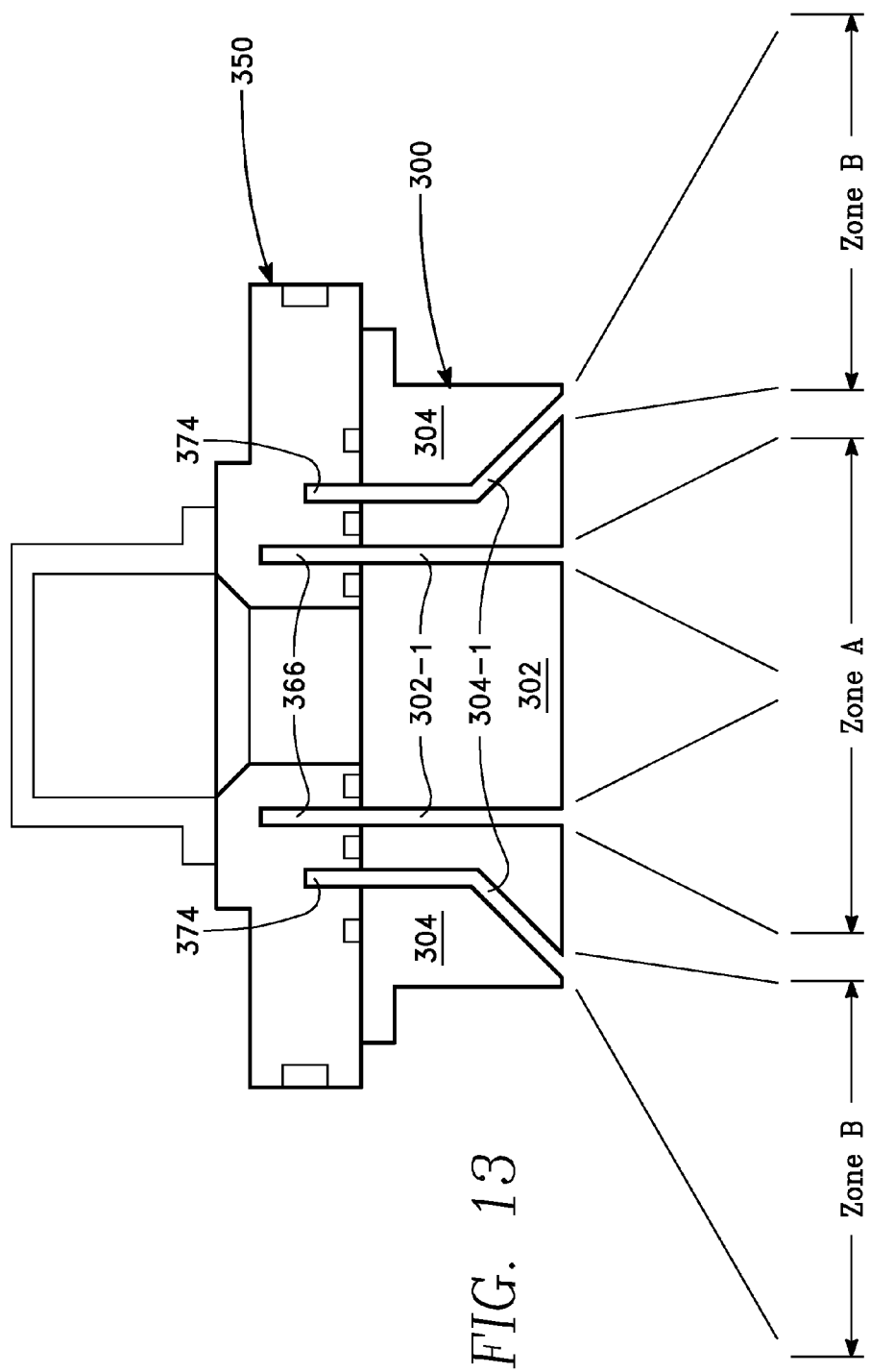
FIG. 13 is an enlarged cut-away view of a center gas disperser of the reactor of FIG. 1.
Figure 14:
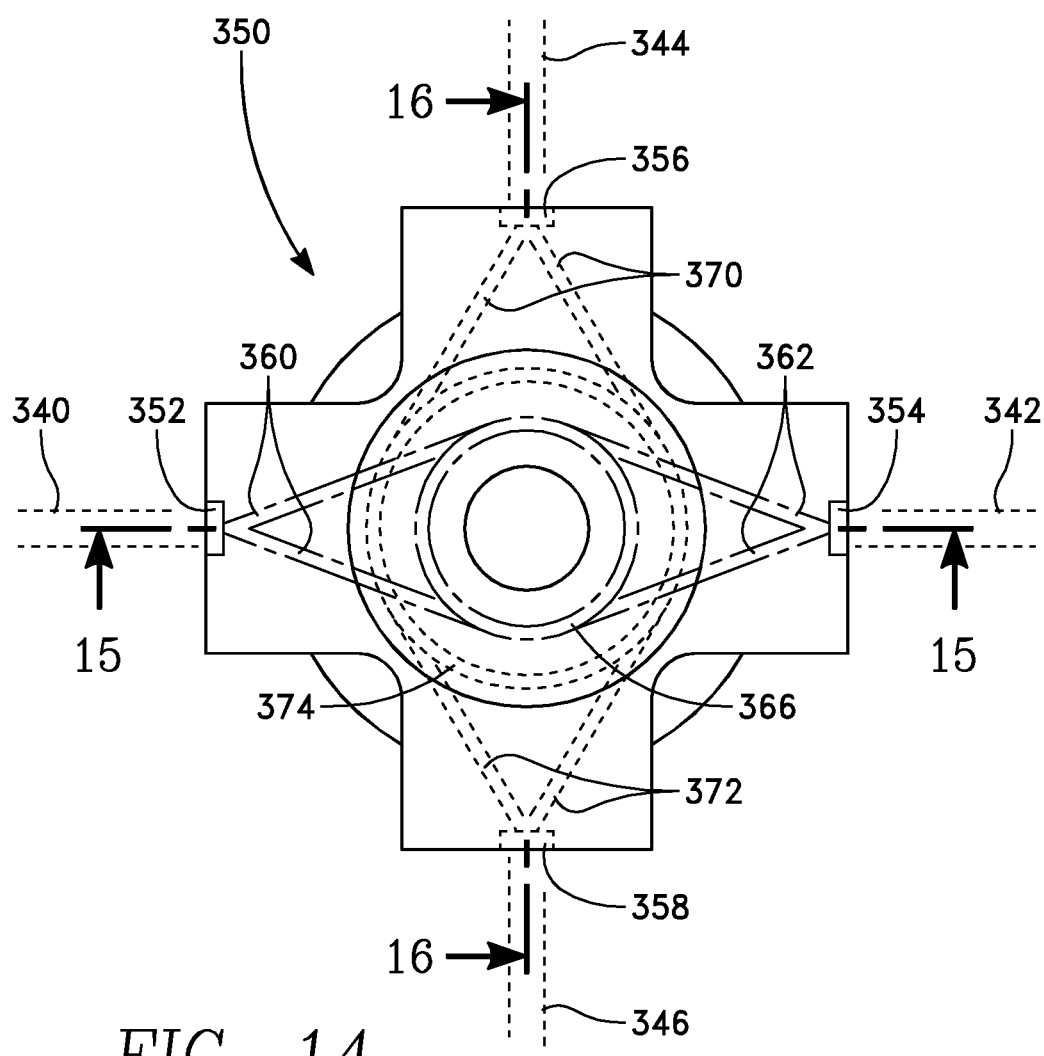
FIG. 14 is a plan view of the center gas disperser of FIG. 13.
Figure 15:
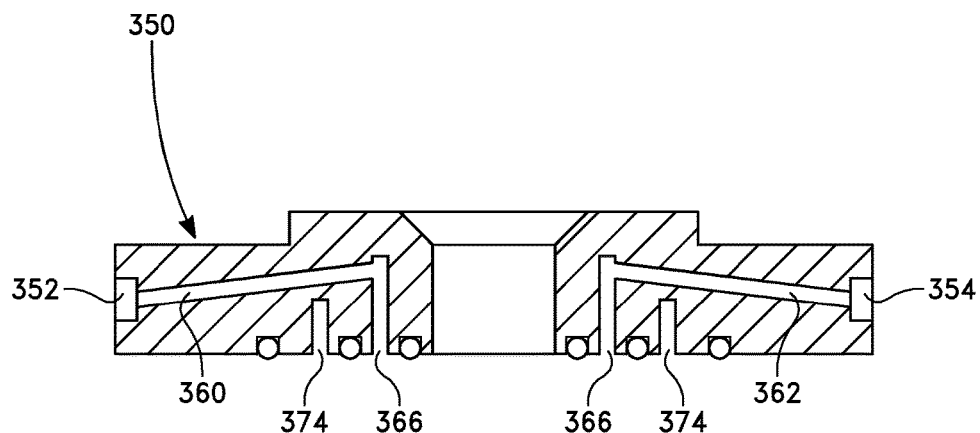
FIG. 15 is a cross-sectional view taken along lines 15-15 of FIG. 14.
Figure 16:
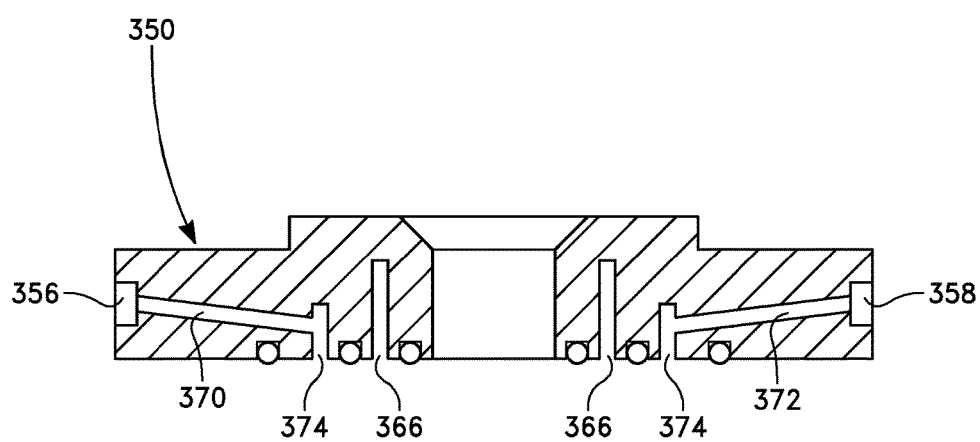
FIG. 16 is a cross-sectional view taken along lines 16-16 of FIG. 14.

As previously described with reference to FIGS. 1 and 12, the gas flow hub 350 provides coupling between the four radial gas flow lines 340, 342, 344, 346 and the dual zone gas injector 300. One example of the dual zone gas injector 300 is depicted in FIG. 13. The dual zone gas injector 300 of FIG. 13 includes a center gas disperser 302 having an axial inner annular channel 302-1 extending axially and dispersing gas to a radially inner zone A, and a middle gas disperser 304 having a slanted middle annular channel 304-1 dispersing gas to a radially outer zone B. The gas flow hub 350 is now described with reference to FIGS. 13, 14, 15 and 16. The hub 350 has four gas inlet ports 352, 354, 356 and 358 oriented at right angles to one another and connectable to the four radial gas flow lines 340, 342, 344, 346 as indicated in dashed line. The gas inlet ports 352 and 354 feed respective pairs of split gas distribution lines 360, 362, respectively, that terminate at four equally spaced points along a circular inner distribution channel 366 that is in registration with the axial inner annular channel 302-1 of the dual zone gas injector 300. The gas inlet ports 356 and 358 feed respective pairs of split gas distribution lines 370, 372, respectively, that terminate at four equally spaced points along a circular middle distribution channel 374 that is in registration with the axial middle annular channel 304-1 of the dual zone gas injector 300.

Figure 11B:
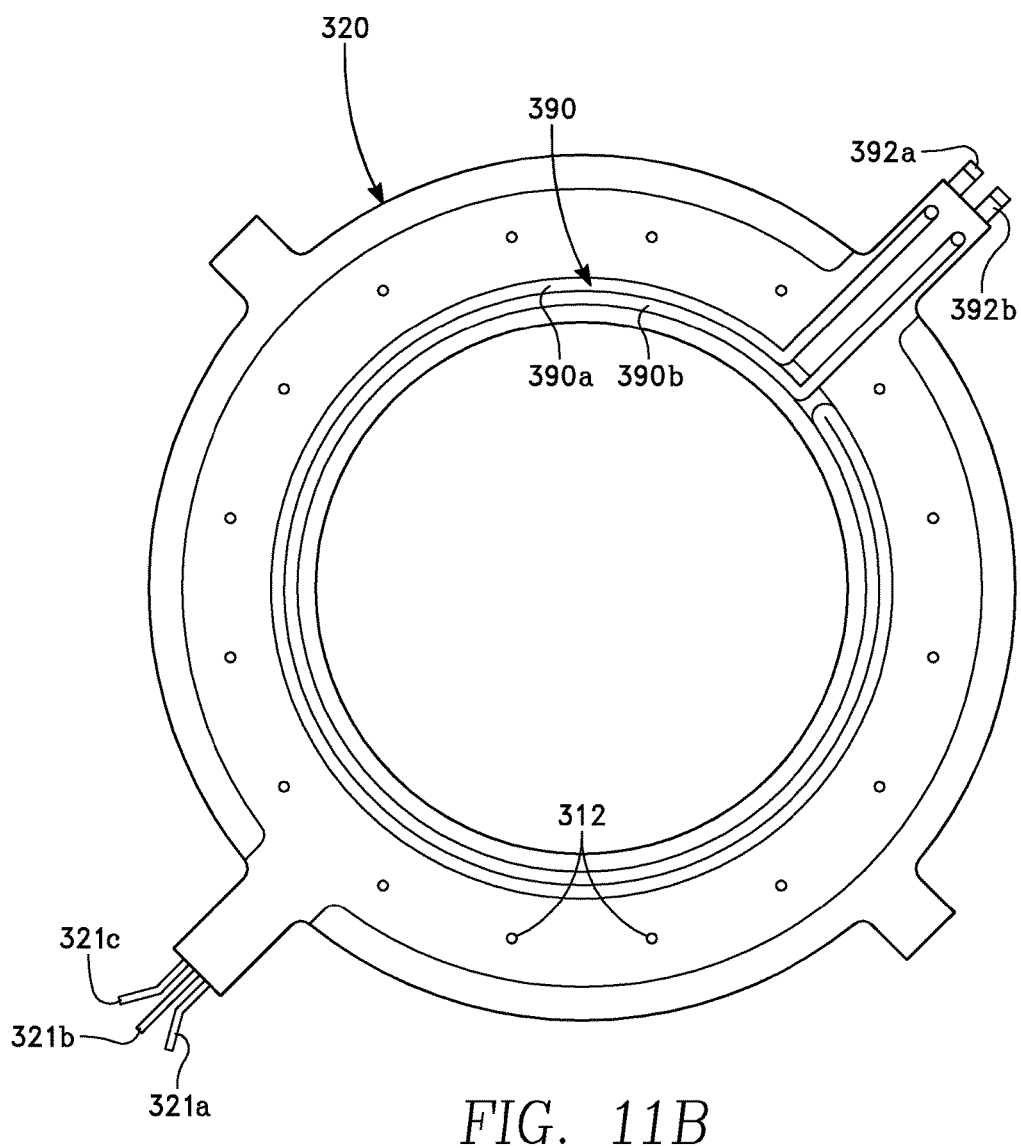
FIG. 11B is a view of an opposite side of the gas flow plate of FIGS. 7 and 11A.

Referring again to the bottom view of FIG. 11B, in one embodiment, optional cooling passages 390 may be provided in the gas flow plate 320, in the form of a circular supply passage 390a and a circular return passage 390b forming a continuous path. External coolant ports 392a and 392b provided connection of the supply and return passages 390a, 390b to an external coolant source (not illustrated in FIG. 11B). Optionally, internal coolant passages may be provided in the outer chamber body wall 170 and fed through a coolant input port.

Figure 17:
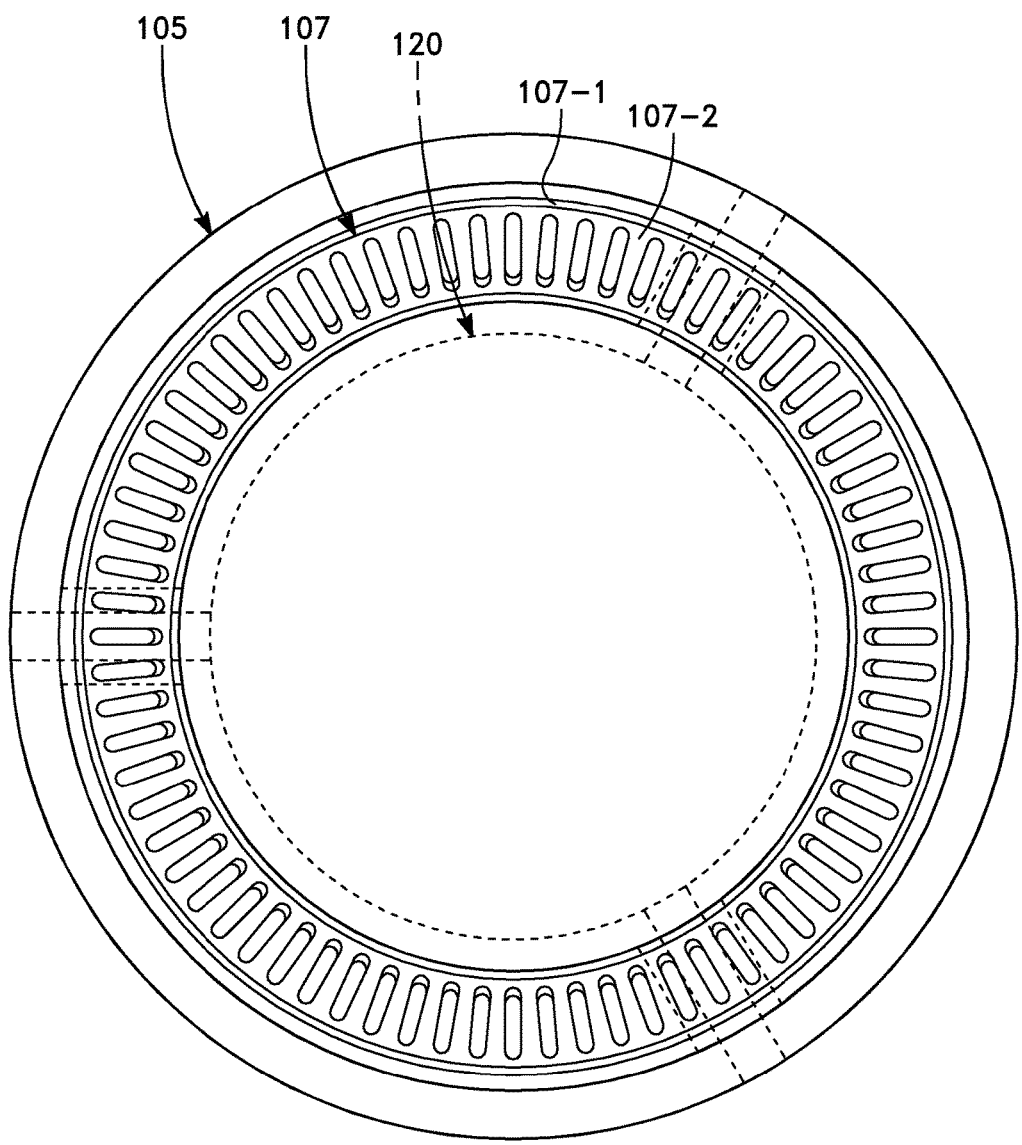
FIG. 17 is a cross-sectional view taken along lines 17-17 of FIG. 1B.
Figure 18:
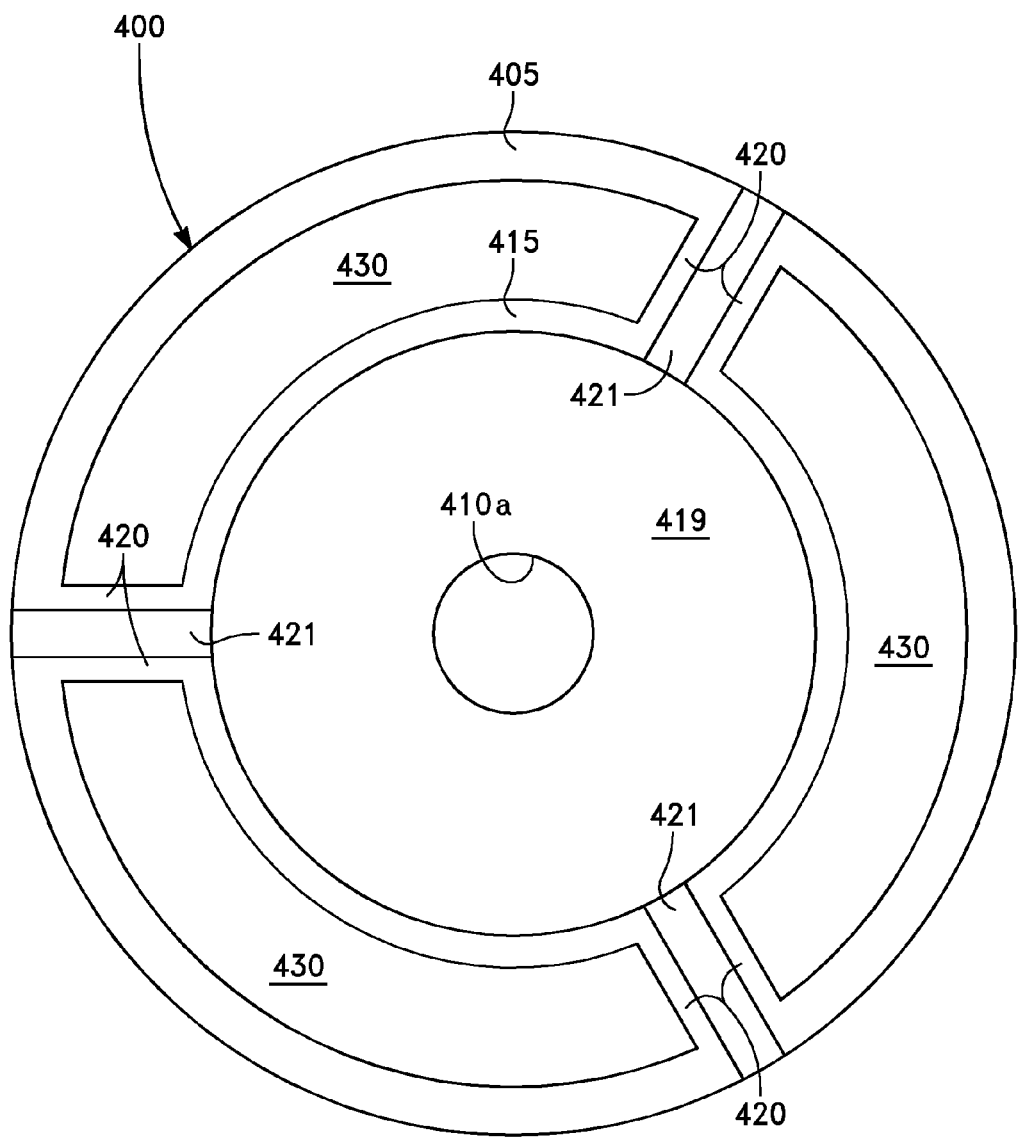
FIG. 18 is a cross-sectional view taken along lines 18-18 of FIG. 1B.

Referring to FIGS. 1 and 1B, the chamber liner 107 is enclosed within a lower chamber body 400 including a cylindrical lower chamber body side wall 405 and a lower chamber body floor 410. The lower chamber body side wall 405 and the lower chamber body floor 410 enclose an evacuation region 411. The chamber liner 107 includes an upper cylindrical section 107-1 and a lower annular grid 107-2 in the form of an inverted truncated cone. A vacuum pump 440 is disposed in a vacuum pump opening 410a in the floor 410 and is centered relative to the axis of symmetry of the side wall 105. A containment wall 415 coaxial with the workpiece support 115 and a flexible bellows 417 extending between the pedestal 120 and the containment wall 415 enclose the workpiece support 115 in an internal central space 419. The central space 419 is isolated from the volume evacuated by the vacuum pump 440, including the evacuation region 411 and the processing region 101. Referring to FIGS. 1B, 17 and 18, there are three hollow radial struts 420 defining radial access passages 421 spaced at 120 degree intervals extending through the chamber body side wall 405 and providing access to the central space 419. Three axial exhaust passages 430 are defined between the three radial struts 420. Different utilities may be provided through different ones of the radial access passages 421, including the RF power cable 132 connected to the electrode 130, heater voltage supply lines connected to heater elements in the workpiece support 115, an electrostatic chucking voltage supply line connected to the electrode 130, coolant supply lines and helium supply lines for backside helium gas channels in the workpiece support surface 121, for example. A workpiece support lift actuator 450 is fixed with respect to the chamber body and moves the workpiece support 115 axially. The workpiece support lift actuator 450 may be used to vary the distance between the workpiece 122 and the lid assembly 110. Varying this distance varies the distribution of plasma ion density. Movement of the lift actuator may be used to improve uniformity of distribution of process (e.g., etch) rate across the surface of the workpiece 122. The lift actuator 450 may be controlled by the user through a programmable controller, for example.

The axially centered exhaust assembly including the vacuum pump opening 410a and the axial exhaust passages 430 avoids asymmetries or skew in processing distribution across the workpiece 122. The annular grid 107-2 masks the processing region 101 from the discontinuities or effects of the radial struts 420. The combination of the axially centered exhaust assembly with the symmetrical distribution of RF current flow below the ground plate 184 minimize skew effects throughout the processing region 101, and enhance process uniformity in the processing region 101.

Figure 19:
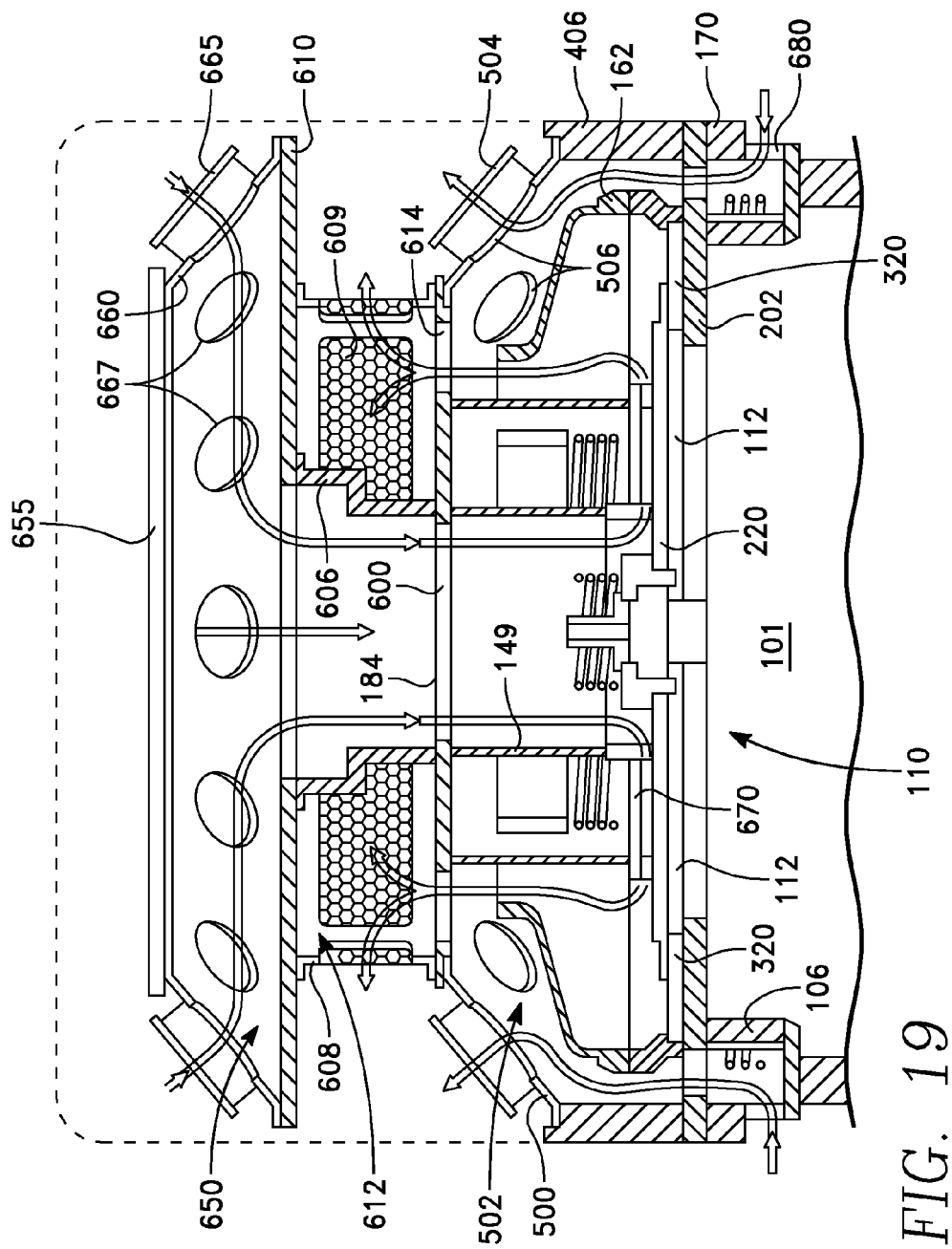
FIG. 19 is a view corresponding to FIG. 1A and depicting cooling air flow paths.

FIG. 19 depicts cooling air flow through the upper section 20 of FIG. 1A. Referring to FIGS. 1A and 19, a chamber body side wall 406 surrounds the lid assembly 110. A lower plenum wall 500 in the form of a truncated cone, for example, is mounted between the top edge of the chamber body side wall 406 and the peripheral edge of the ground plate 184, to enclose a lower plenum 502. A circular array of exhaust fans 504 are mounted in respective openings 506 in the lower plenum wall 500.

The ground plate 184 has a center opening 600 that is co-extensive with the inner ground shield 149. A cylindrical plenum center wall 606 is coextensive with the center opening 600. A plenum plate 610 overlies the plenum center wall 606. A return chamber 612 is enclosed between a return chamber side wall 608, the plenum plate 610, the ground plate 184 and the center wall 606. The return chamber side wall 608 includes air flow screen sections 609. Openings 614 through the ground plate 184 permit air flow between the lower plenum 502 and the return chamber 612.

An upper plenum 650 is enclosed between a top plate 655 and the plenum plate 610 by an upper plenum side wall 660 in the form of a truncated cone. Plural intake fans 665 are mounted at respective openings 667 in the upper plenum side wall 660.

The intake fans 665 draw air into the upper plenum 650 which flows down through the central opening formed by the center wall 606, the ground plate opening 600 and the middle grounded shield 149. An annular air flow plate 670 overlying the disk-shaped dielectric window 112 confines the air flow between the plate 670 and the window 112. This air may flow through the apertures 226 of the Faraday shield 220 of FIG. 8, for example. Alternatively (or in addition), the air may be confined in a gap between the air flow plate 670 and the window 112. Downward air flow through the cylindrical shield 149 enters the space within each aperture 226 through a central opening of the plate 670 and flows radially outwardly over the disk-shaped dielectric window 112 and enters the lower plenum 502. From the lower plenum 502, the air escapes into the return chamber 612, from which it may exit through the screen sections 609 of the return chamber side wall 608. Thus, the intake fans 665 provide cooling for the disk-shaped dielectric window 112.

The exhaust fans 504 provide cooling for the cylindrical dielectric window 106. The exhaust fans 504 draw air through intake ports 680 in the lower chamber side wall 170 and past the cylindrical dielectric window 106. By operating the intake fans 665 independently from the exhaust fans 504, the different heat loads on the different dielectric windows 106 and 112 may be compensated independently, for accurate temperature control of each window.

Figure 20A:
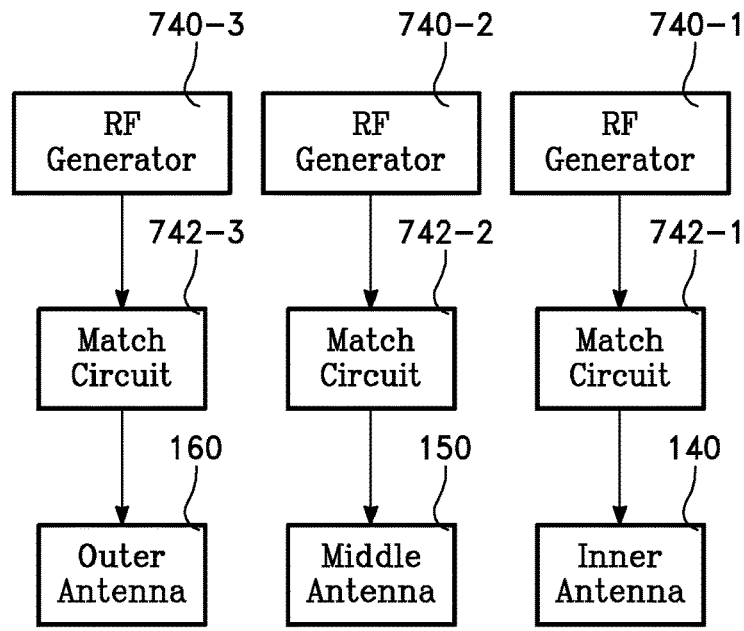
FIGS. 20A and 20B are block diagrams of alternative embodiments of RF power sources for the RF power applicators of FIG. 1A.
Figure 20B:
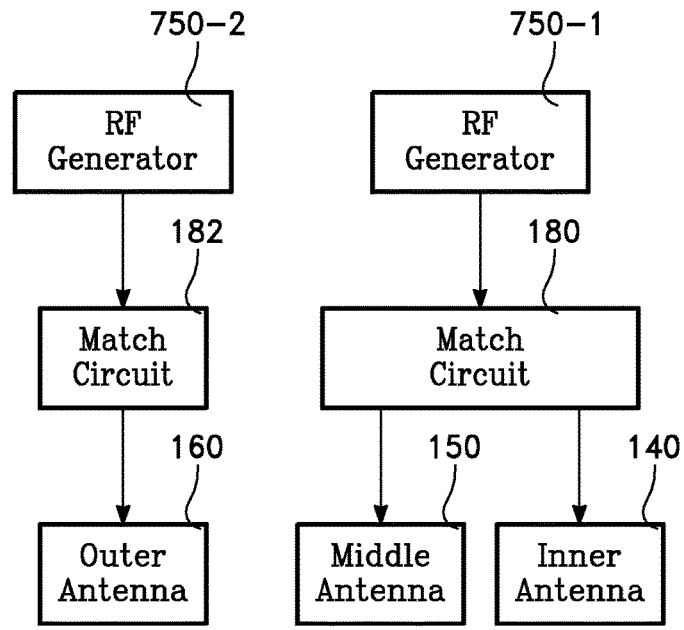

FIG. 20A depicts one embodiment of an RF source for the three coil antennas 140, 150, 160, the RF source having independent RF generators 740-1, 740-2, 740-3, and RF impedance matching networks 742-1, 742-1, 742-3 for the respective coil antennas 140, 150, 160. FIG. 20B depicts an embodiment in which the inner and middle coil antennas 140, 150 are driven from a single RF generator 750-1 through an RF impedance matching network 180 having dual outputs. The dual output RF impedance matching network 180 may facilitate differential control of the power levels applied to the inner and middle coil antennas 140, 150. The outer coil antenna 160 is driven by an RF generator 750-2 through an RF impedance matching network 182. The dual output RF impedance matching network 180 functions as two separate RF power sources, so that there are a total of three RF power sources in the system. In each of the foregoing embodiments, the RF impedance matching networks may be disposed on the top plate 655 as depicted in FIG. 1A.

Figure 21:
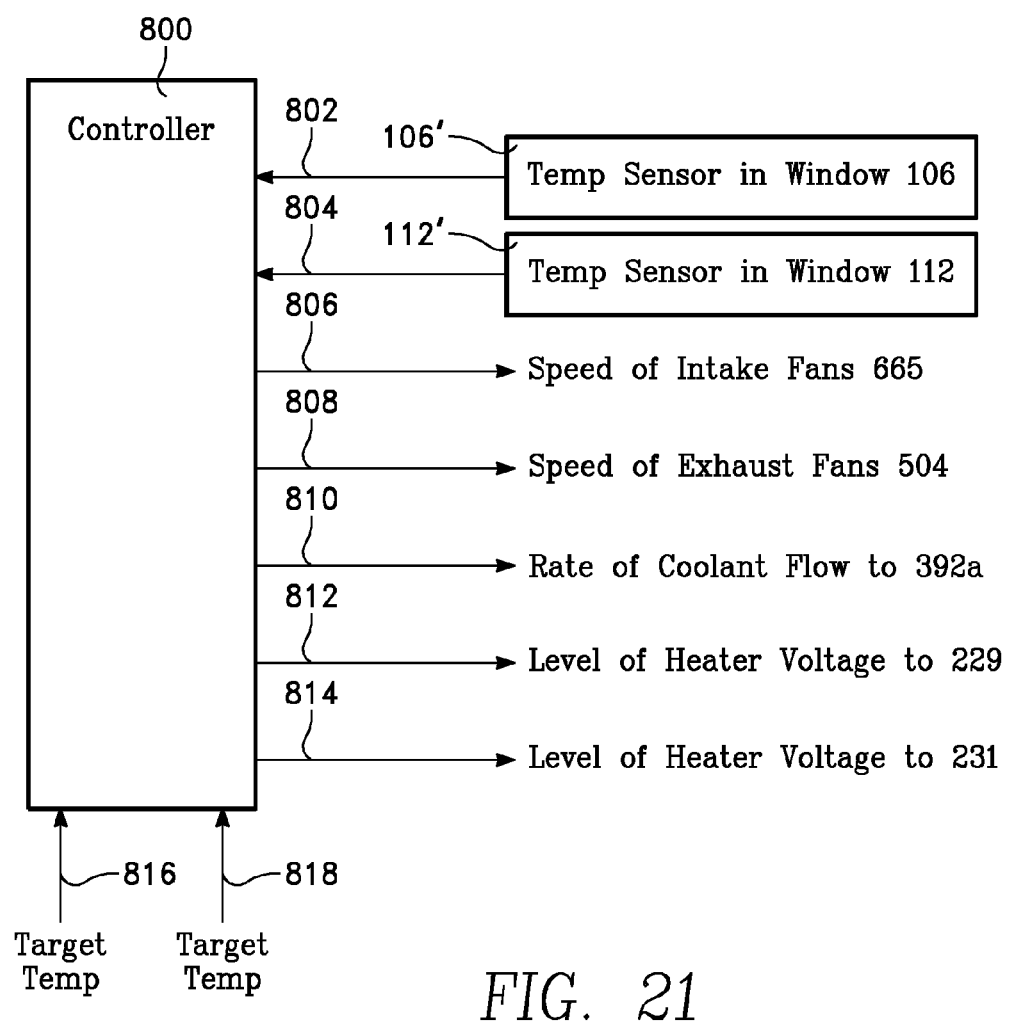
FIG. 21 is a block diagram of a control system controlling the reactor of FIG. 1.

FIG. 21 depicts a control system for controlling the plasma reactor of FIG. 1. The control system is responsive to temperature sensors at different locations within the plasma reactor, such as a temperature sensor 106' at or in the cylindrical dielectric window 106, and a temperature sensor 112' at or in the disk-shaped dielectric window 112. The control system includes a programmable controller 800 which may be implemented as a microprocessor, for example. The controller 800 has an input 802 for receiving the output of the temperature sensor 106' and an input 804 for receiving the output of the temperature sensor 112'. The controller 800 has independent command outputs, including an output 806 governing the speed of the intake fans 665, an output 808 governing the speed of the exhaust fans 504, an output 810 governing the flow rate of coolant to the coolant port 392*a* in the gas flow plate 320, an output 812 governing the power level to the electric heater 229 near the dielectric window 112, and an output 814 governing the power level to the electric heater 231 at the cylindrical dielectric window 106.

The controller 800 in one embodiment is programmed to govern the outputs 808-814 in response to the inputs 802, 804 to maintain the windows 106, 112 at respective target temperatures that may be furnished by a user to controller inputs 816 and 818. The controller 800 may be programmed to operate in the manner of a feedback control loop to minimize the difference between the user input 816 and the sensor input 802, and to minimize the difference between the user input 818 and the sensor input 804.

As described above, some of the advantageous effects of various ones of the foregoing embodiments include symmetrical distribution of RF power to the coil antennas for enhanced plasma distribution symmetry. Shielding of the coils from asymmetrical RF current feed structures reduces skew effects in plasma distribution. Shielding of the coil antenna feeds from one another enhances independent control of the coil antennas, for superior control of plasma density distribution. Symmetrical chamber exhaust in combination with the symmetrical coil antennas provides a high density plasma source with symmetrical plasma distribution. Separate dielectric windows for different RF coils enables independent thermal control of the different dielectric windows. Separately supporting the different dielectric windows at or over the processing region enables the chamber diameter to be increased beyond the diameter of each individual dielectric window, facilitating a large increase in chamber diameter. The moveable workpiece support electrode in combination with symmetrical coil antenna(s) allows superior control over center-to-edge plasma density distribution with a minimized asymmetrical non-uniformity component. The moveable workpiece support electrode in combination with symmetrical coil antenna(s) and in further combination with the symmetrical chamber exhaust allows even better control over center-to-edge plasma density distribution with minimized asymmetrical non-uniform component.

FIGS. 22-27 depicts an RF feed structure which can have triangular symmetry, in one embodiment. The embodiment of FIGS. 22-27 is a modification of the embodiment of FIG. 1A and includes elements described above with reference to FIG. 1A, for which identical reference numerals are used. The embodiment of FIGS. 22-27 includes a ceiling plate 900 overlying a cylindrical side wall 902 above the top plate 655. Three RF power terminals 904*a*, 904*b*, 904*c* are provided at the ceiling plate 900, and may be housed in a connection module 904 held in the ceiling plate 900. A center RF connection rod 906 is connected between the RF power terminal 904*a* and the RF current distributor 142 for the inner coil 140.

RF power for the middle coil 150 is distributed to the four axial RF feed rods 158 by a middle RF distribution ring 908 having four radial arms 910*a*-910*d* (FIG. 26) connected to the tops of the respective RF feed rods 158. The middle RF distribution ring 908 is disposed above and spaced from the conductive ground plate 184. A middle RF connection rod 912 is connected between the RF power terminal 904*b* and the middle RF distribution ring 908.

The ground plate 184 has a center opening 600. In one embodiment, the center opening 600 may be covered by a conductive grill 970 that permits air flow through the center opening 600.

RF power for the outer coil 160 is distributed to the eight axial RF feed rods 168 by an outer distribution cylinder 914. In one embodiment, the outer distribution cylinder 914 is coaxial with the axis of symmetry of the coils 140, 150 and 160. The outer distribution cylinder 914 has a top portion 914*a* (FIG. 25) above the top plate 655 and a bottom portion 914*b* below the plenum plate 610. Eight radial arms 915*a*-915*h* (FIG. 25) extend from the bottom 914*b* of the outer distribution cylinder 914 to respective ones of the eight axial RF feed rods 168. An outer RF connection rod 916 (FIGS. 24 and 25) is connected between the top 914a of the outer distribution cylinder 914 and the RF power terminal 904c. The outer distribution cylinder 914 is hollow in one embodiment and surrounds the center RF connection rod 906 and the middle RF connection rod 912. The outer distribution cylinder 914 extends through openings 610a, 655a in the grounded plates 610 and 655 respectively. The diameters of the openings 610a and 655a are sufficient to provide gaps 611, 656, respectively, between the grounded plates 610, 655 and the outer distribution cylinder 914. In one embodiment, the gaps 611 and 656 are sufficiently wide to prevent electrical discharge or breakdown at operating (e.g., atmospheric) pressure, given the RF voltage supplied at the RF power terminal 904c.

The bottom 914b of the outer distribution cylinder 914 is at an axial location above the middle RF distribution ring 908. In one embodiment, the outer distribution cylinder 914 and the middle RF distribution ring 908 are coaxial and axially separated from one another, and may be of the same diameter. In one embodiment, the middle RF distribution ring 908 fits between the bottom 914b of the outer distribution cylinder 914 and the grounded plate 184. The middle RF distribution ring 908 is separated from the bottom 914b of the outer distribution cylinder 914 and from the ground plate 184. In one embodiment, the axial length of the middle RF distribution ring 908 is less than the axial distance between the bottom 914b of the outer cylinder 914 and the ground plate 184.

Figure 24:
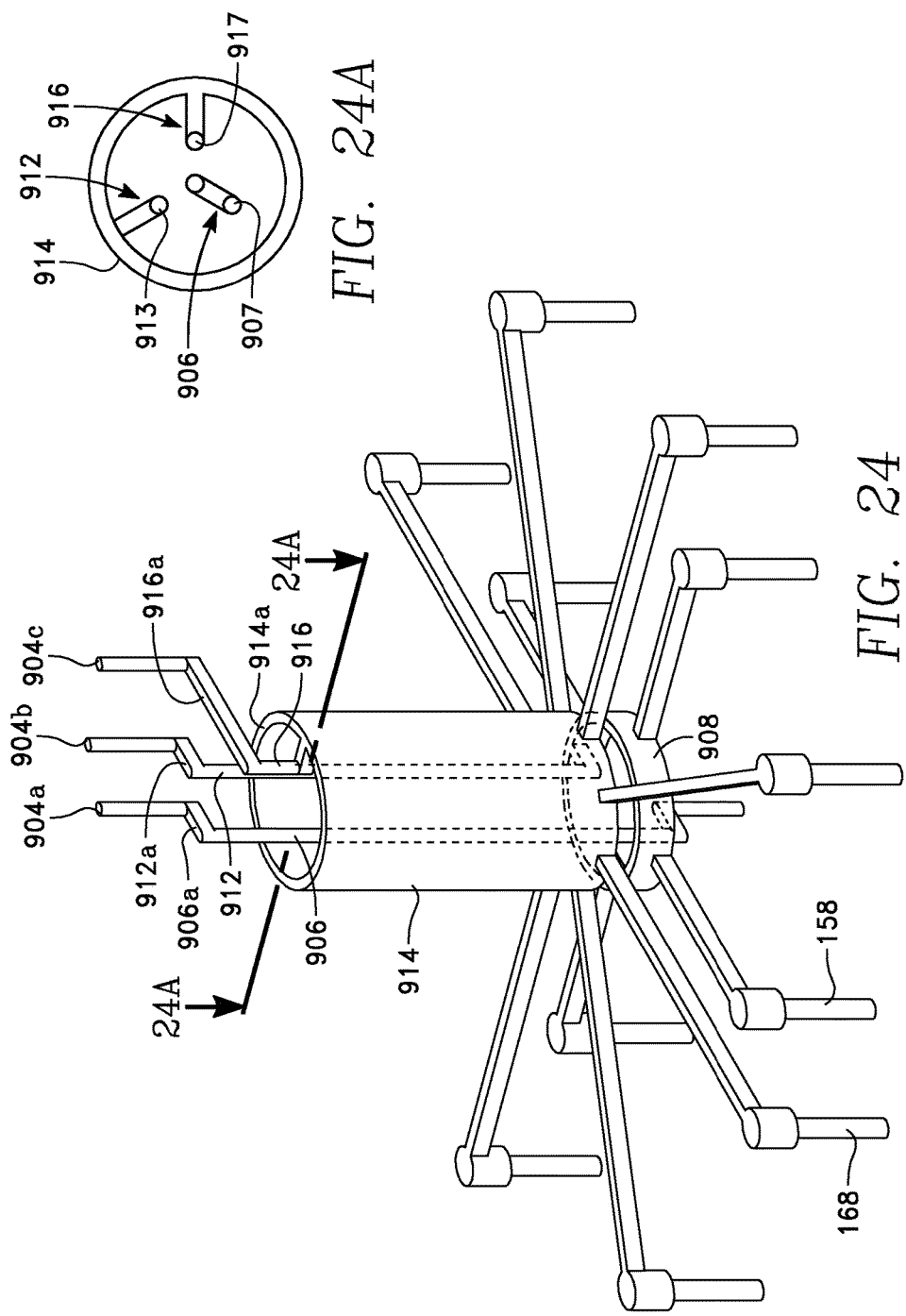
FIG. 24 depicts an assembly including a middle coil RF feed and an outer coil RF feed of FIG. 22
Figure 28:
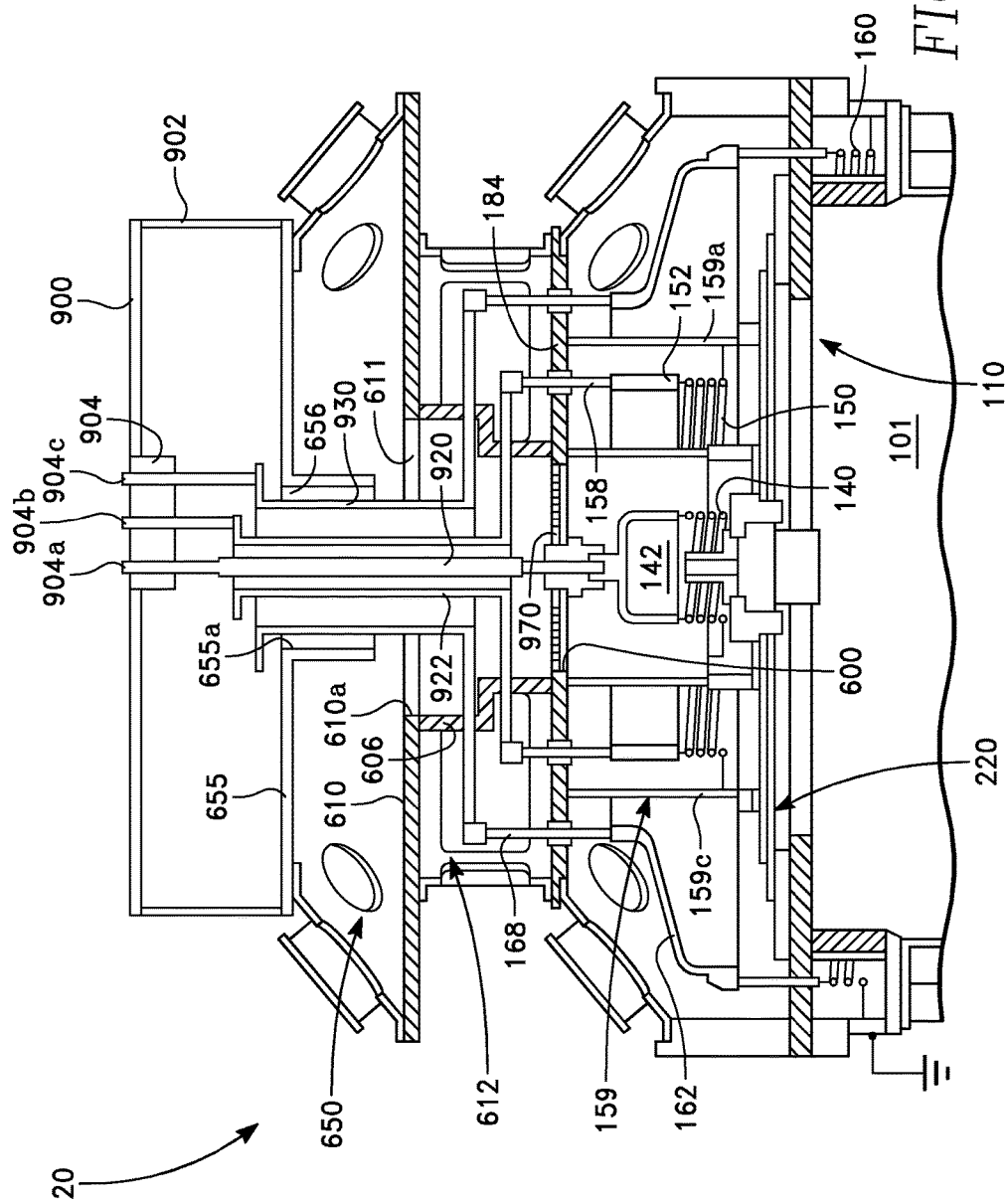
FIG. 28 is a cross-sectional elevational view of a further embodiment in which RF feeds to the coil antennas have coaxial symmetry.
Figure 29:
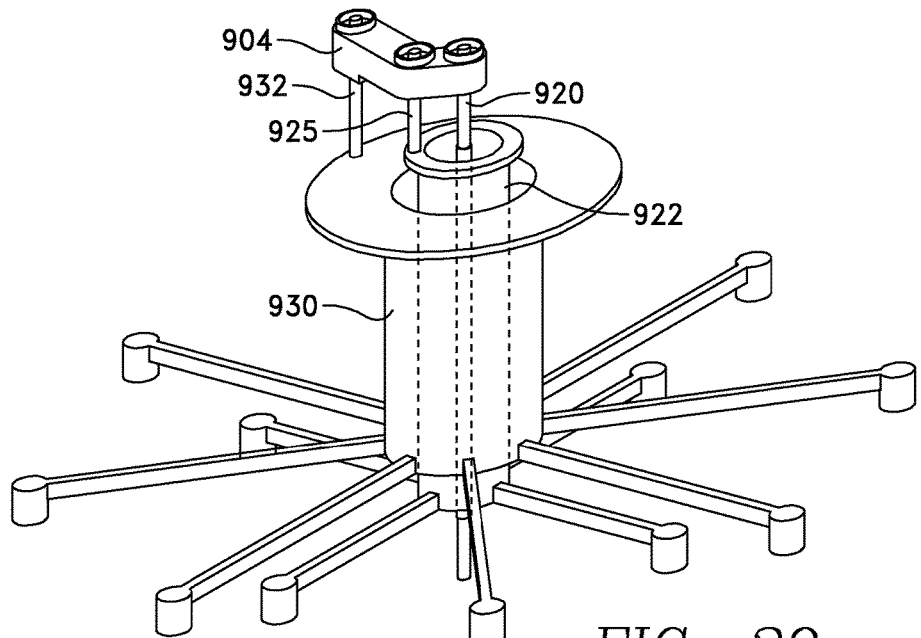
FIG. 29 depicts an assembly including a middle coil RF feed and an outer coil RF feed of FIG. 28.
Figure 30:
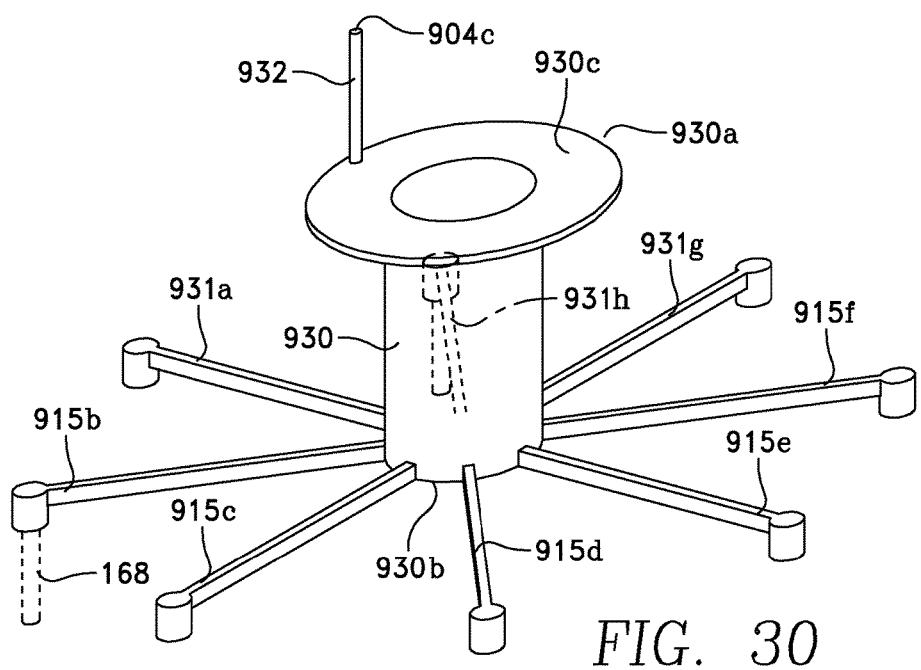
FIG. 30 depicts an assembly including an outer coil RF feed of FIG. 28.
Figure 31:
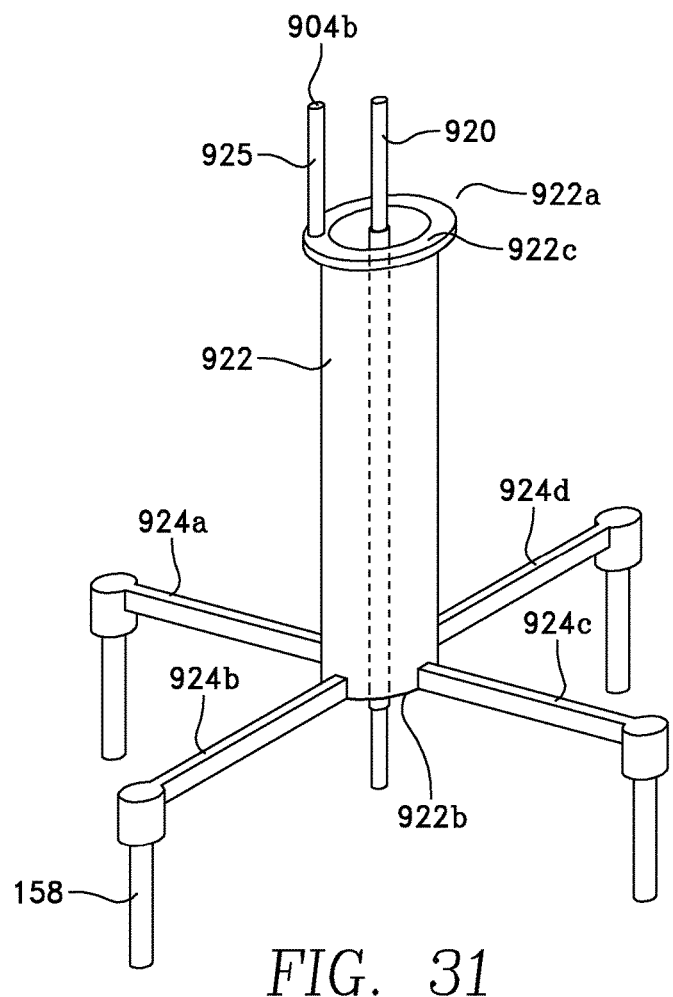
FIG. 31 depicts an assembly including a middle coil RF feed of FIG. 28.

In one embodiment, the edge of the top portion 914a of the outer distribution cylinder 914 lies adjacent a radial plane coinciding with section line 24A-24A of FIG. 24. The three RF connection rods 906, 912 and 916 extend axially and intersect the radial plane of the top edge of the outer distribution cylinder 914 at three points 907, 913 and 917 (FIG. 24A) respectively. In one embodiment, the three points of intersection 907, 913 and 917 are symmetrically arranged as the vertices of an equilateral triangle, providing a triangular symmetry within the outer distribution cylinder 914. In one embodiment, the RF connection rods 906, 912 and 916 have radial transition sections 906a, 912a and 916a, respectively, that locate the top ends of the rods 906, 912 and 916 in registration with respective ones of the RF power terminals 904a, 904b and 904c. The radial transition sections 906a, 912a and 916a are above the radial plane coinciding with the section line 24A-24A.

FIGS. 28-31 depict a modification of the embodiment of FIGS. 22-27, in which, in one embodiment, the RF feed structure has coaxial symmetry. A center RF connection rod 920 is connected between the RF power terminal 904a and the RF current distributor 142 for the inner coil 140. In one embodiment, the center RF connection rod 920 is straight and coincides with the axis of symmetry of the coil 140.

In the embodiment of FIGS. 28-31, RF power for the middle coil 150 is distributed to the four axial RF feed rods 158 by a middle RF distribution tube 922. The middle RF distribution tube 922 is hollow and cylindrical in one embodiment. The middle RF distribution tube 922 has a top portion 922a (FIG. 31) above the top plate 655 and a bottom portion 922b below the plenum plate 610. Four radial arms 924a-924d extend radially outwardly from the bottom portion 922b of the middle RF distribution tube 922 to the tops of the respective RF feed rods 158. In one embodiment, the top portion 922a of the middle RF distribution tube 922 has an annular flange 922c extending radially outwardly from the RF distribution tube 922. An axial middle RF connection rod 925 mounted on the annular flange 922c extends upwardly to the RF power terminal 904b. In one embodiment, the middle RF distribution tube 922 surrounds and is coaxial with the center RF connection rod 920.

In the embodiment of FIGS. 28-31, RF power for the outer coil 160 is distributed to the eight axial RF feed rods 168 by an outer distribution cylinder 930. In one embodiment, the outer distribution cylinder 930 is hollow and is coaxial with the axis of symmetry of the coils 140, 150 and 160.

The outer distribution cylinder 930 has a top portion 930a (FIG. 30) above the top plate 655 and a bottom portion 930b below the plenum plate 610. Eight radial arms 931a-931h extend from the bottom portion 930b of the outer distribution cylinder 930 to respective ones of the eight axial RF feed rods 168. In one embodiment, the top portion 930a of the outer distribution cylinder 930 has an annular flange 930c lying in a radial plane and extending radially outwardly from the outer distribution cylinder 930. In one embodiment, the annular flange 930c is axially below the level of the annular flange 922c of the middle RF distribution tube 922. An outer connection rod 932 extends upwardly from the annular flange 930c to the RF power terminal 904c. The outer distribution cylinder 930 surrounds and is coaxial with the middle RF distribution tube 922. The outer distribution cylinder 930 extends through openings 610a, 655a in the grounded plates 610 and 655 respectively. The diameters of the openings 610a and 655a are sufficient to provide respective gaps 611, 656 between the respective plates 610, 655 and the outer distribution cylinder 930. In one embodiment, the gaps 611 and 656 are sufficiently wide to prevent electrical discharge or breakdown at operating (e.g., atmospheric) pressure, given the RF voltage supplied at the RF power terminal 904c.

Figure 32:
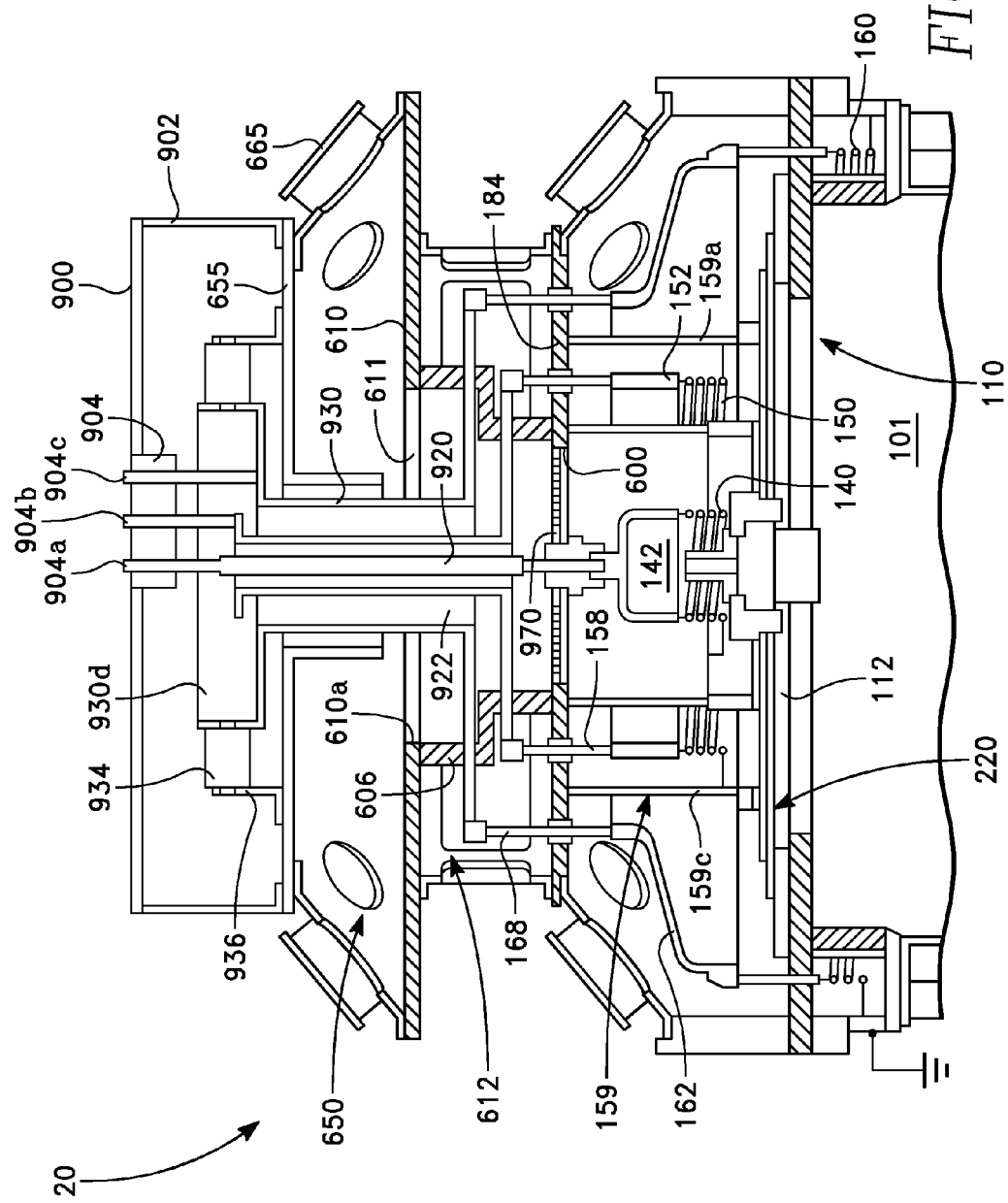
FIG. 32 is a cross-sectional elevational view of a further embodiment with coaxial RF feeds to the coil antennas having a symmetrical array of capacitors connected in parallel with the outer coil RF feed.
Figure 33:
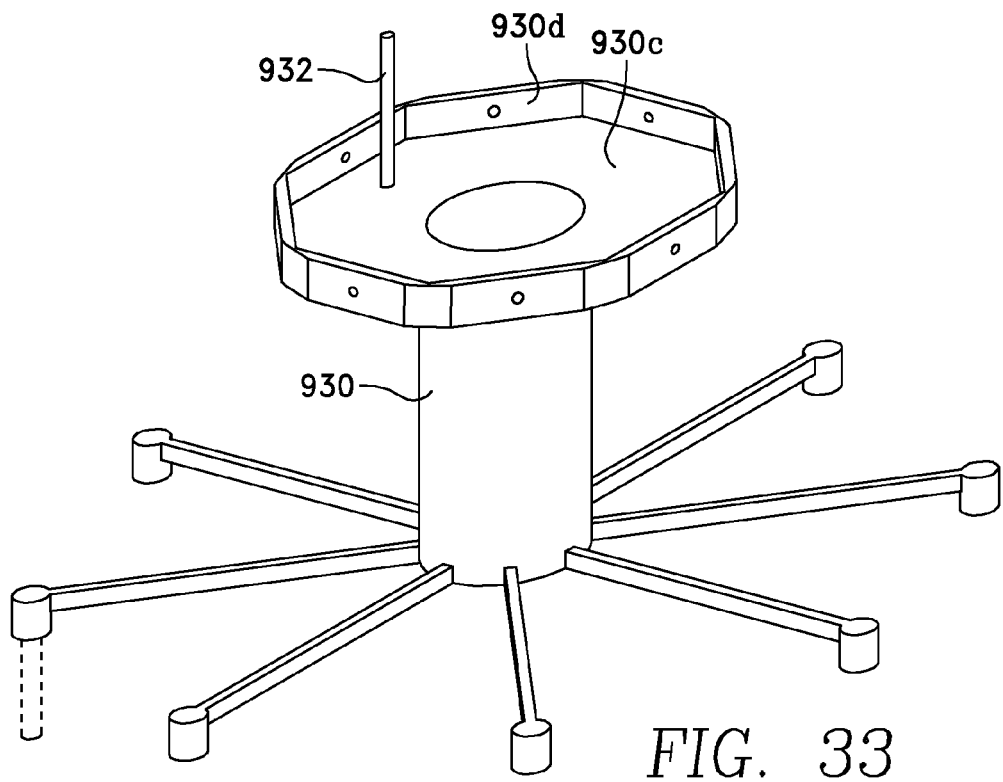
FIG. 33 depicts an assembly including an outer coil RF feed of FIG. 32.
Figure 34:
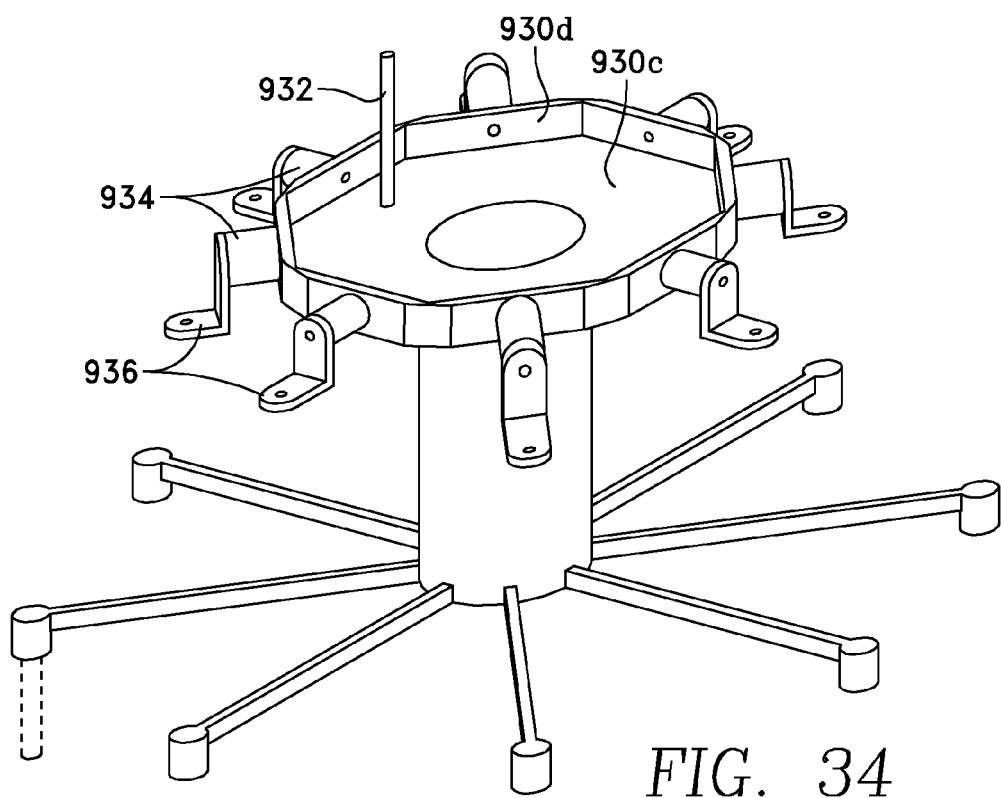
FIG. 34 depicts the assembly of FIG. 33 further depicting the array of capacitors of FIG. 32.

FIGS. 32-34 depict a modification of the embodiment of FIGS. 28-31 in which spaced-apart capacitors 934 are connected between the outer distribution cylinder 930 and the ceiling plate 655. The capacitors 934 are connected in parallel and uniformly spaced in one embodiment and their capacitance is selected to provide resonance at the frequency of the RF power applied to the outer coil 160. The effect of such resonance is to enhance uniformity of RF power distribution in the RF feed structure including the outer distribution cylinder 930. In one embodiment, an axial lip 930d extends upwardly from the outer edge of the axial flange 930c, and is polygonal in shape, having plural flat faces on which respective ones of the capacitors 934 are mounted and connected to the axial lip 930d. A right angle bracket 936 is provided for connecting the outwardly facing end of each capacitor 934 to the ceiling plate 655. In the illustrated embodiment, there are eight capacitors 934 and the axial lip 930d has eight faces, although any suitable number of capacitors and faces may be employed.

Figure 22:
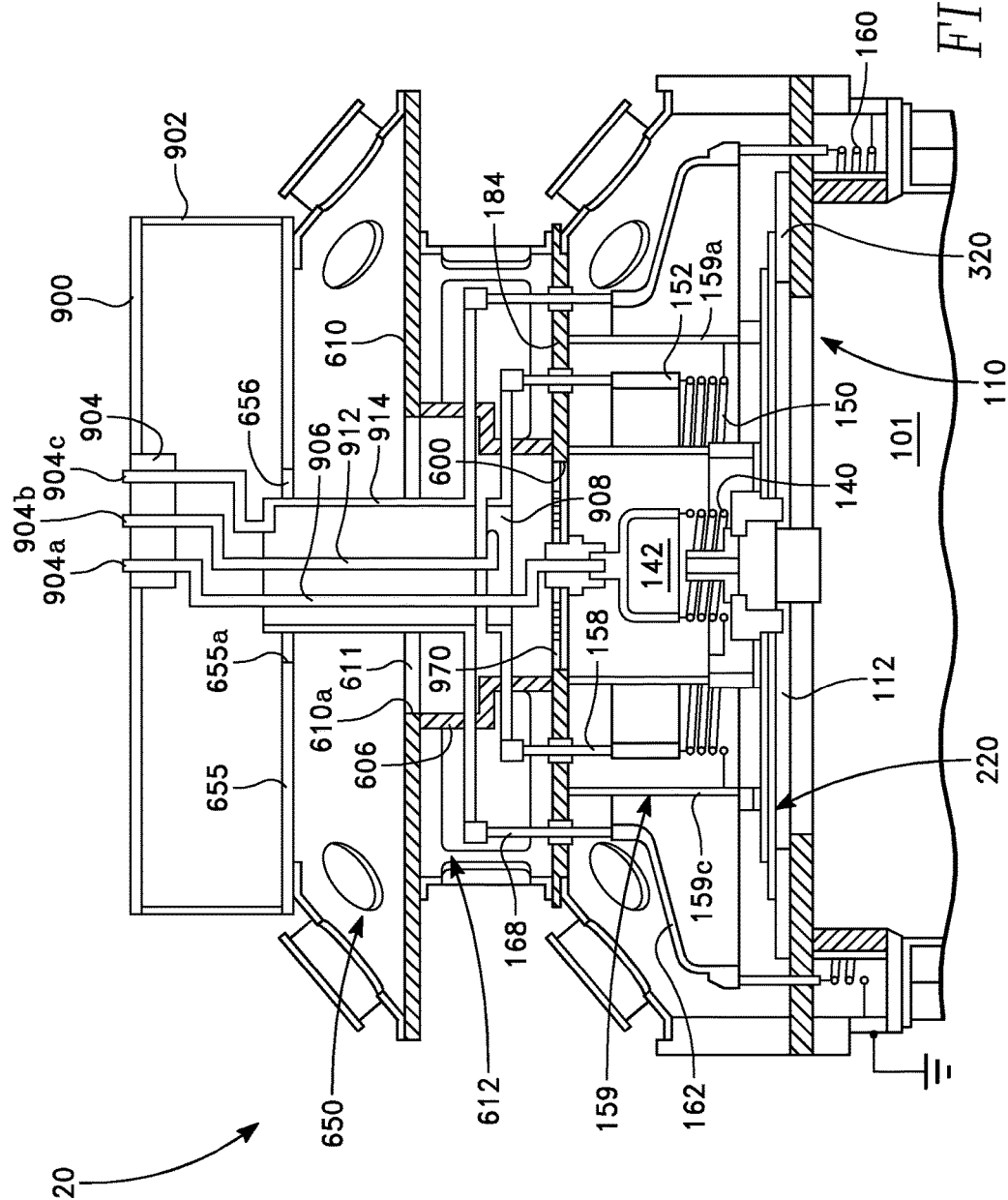
FIG. 22 is a cross-sectional elevational view of a further embodiment in which RF feeds to the coil antennas have triangular symmetry.
Figure 23:
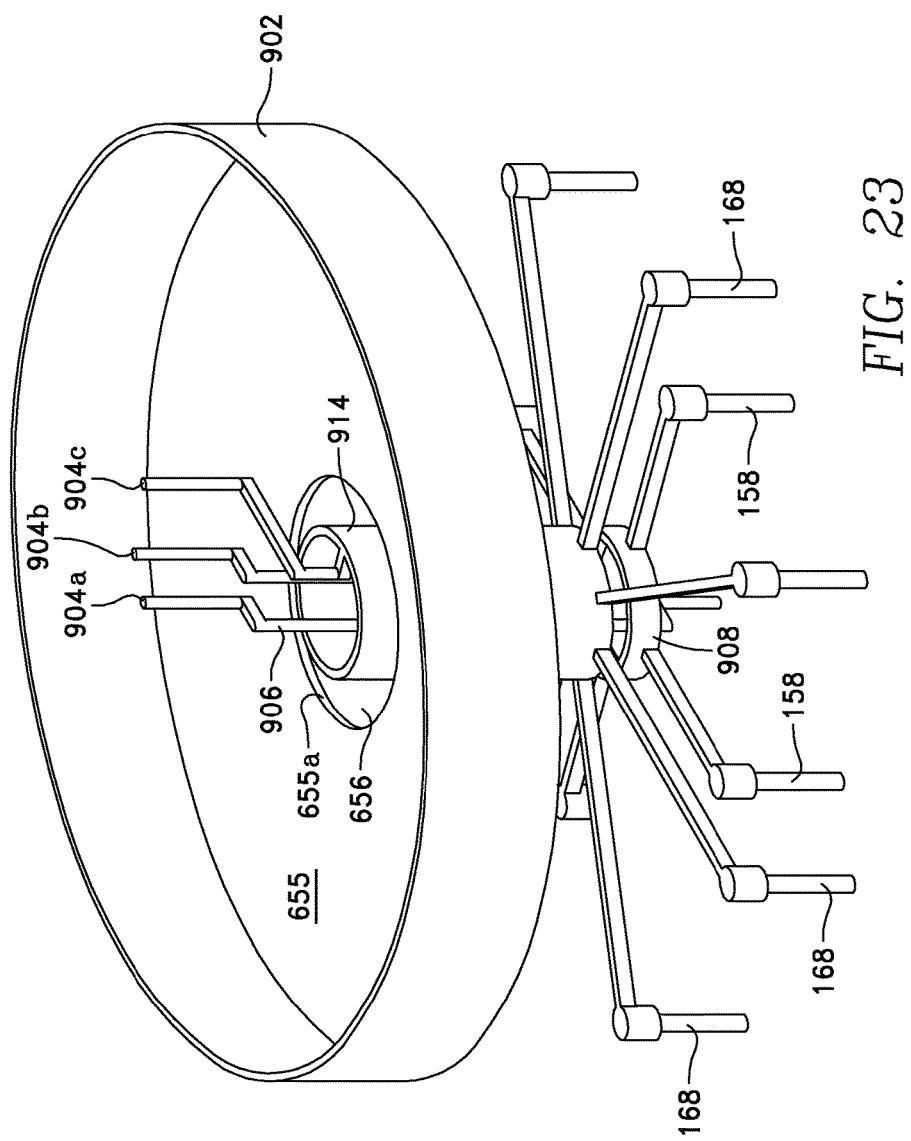
FIG. 23 depicts an assembly including an outer coil RF feed of FIG. 22.

The array of capacitors 934 of FIGS. 32-34 may also be incorporated into the embodiment of FIG. 22. In one implementation, the capacitors are connected between the outer distribution cylinder 914 of FIG. 22 and the ceiling plate 655, for example.

Figure 35:
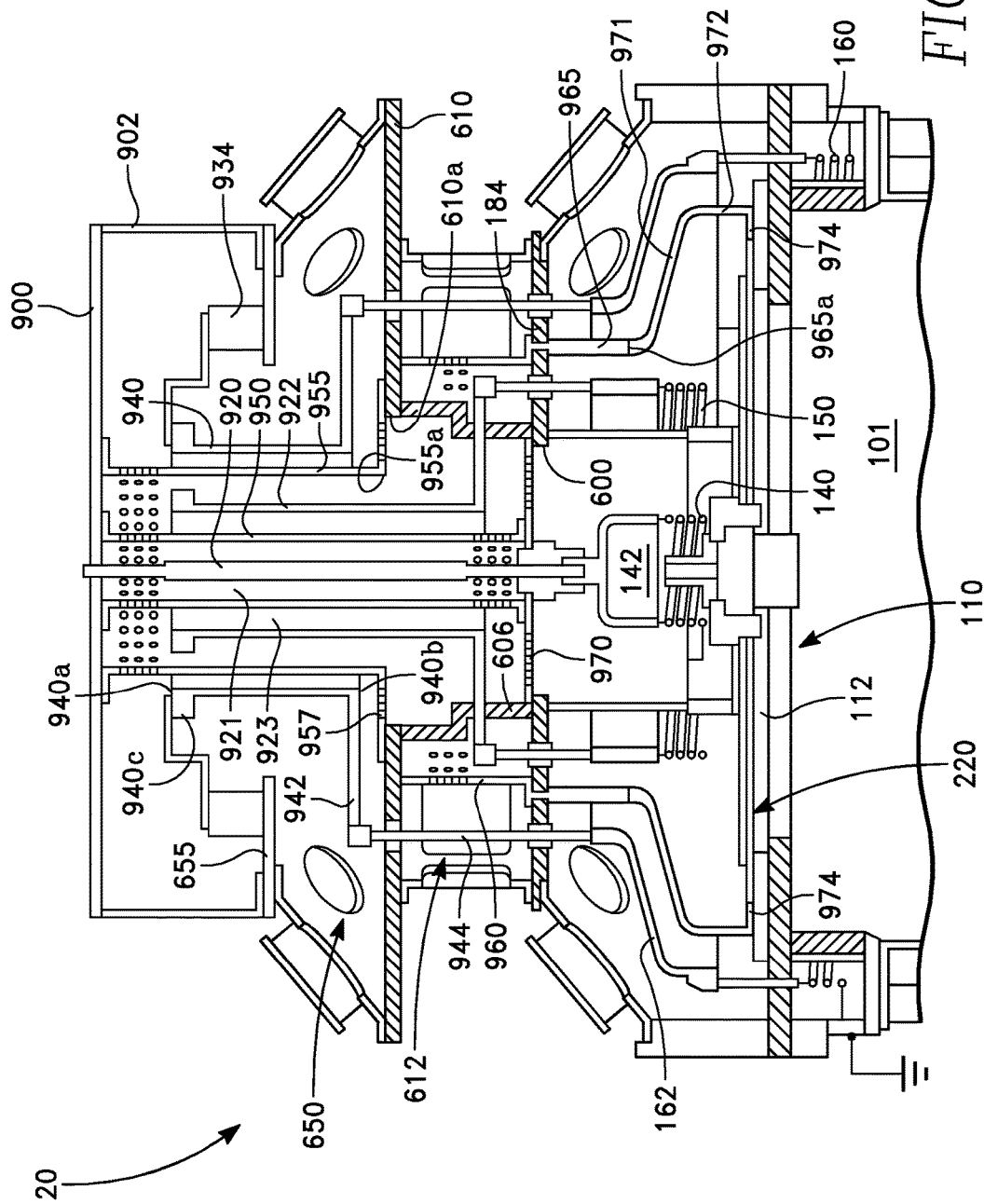
FIG. 35 is a cross-sectional elevational view of a further embodiment having coaxial shielding between the RF feeds.
Figure 36:
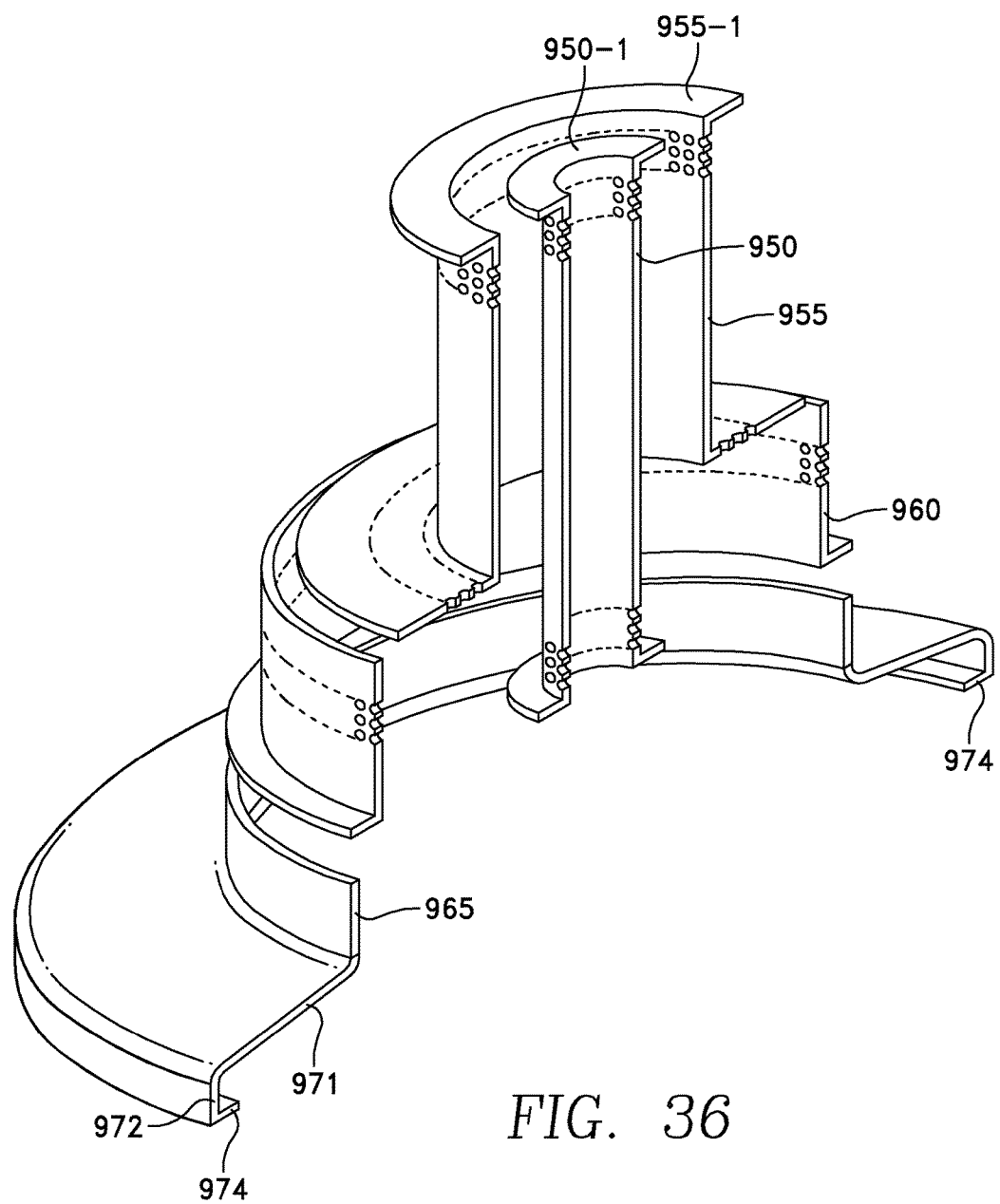
FIG. 36 is an orthographic projection of the coaxial shielding of FIG. 35.

FIGS. 35-36 depict a modification of the embodiment of FIGS. 32-34, having electromagnetic shielding between the RF feeds to the three coils 140, 150, 160. In one embodiment, this feature enhances their independent control. In FIGS. 35-36, the outer distribution cylinder 930 is replaced by a shortened outer distribution cylinder 940 that extends downwardly from its top end 940a by a short distance to its bottom end 940b and does not reach the plenum plate 610. A radial flange 940c extends outwardly from the top end 940a of the shortened outer distribution cylinder 940. A skirt 942 extends radially outwardly from the bottom end 940b of the shortened outer distribution cylinder 940. RF feed rods 944 extend axially through individual holes in the plenum plate 610 and through openings in the ground plate 184 without electrically contacting the plenum plate 610 or ground plate 184. The RF feed rods 944 are connected at their top ends to the periphery of the skirt 942 and are connected at their bottom ends to the top of the RF current distributor 162 for the outer coil 160.

An inner shield 950 surrounds the center RF connection rod 920 and lies within the hollow interior of the middle RF distribution tube 922. In one embodiment, the inner shield 950 is a hollow cylinder having a radially extending flange 950-1 at its top end. The inner shield 950 extends down to (and contacts) the conductive grill 970, where it is terminated. In one embodiment, the inner shield 950 electromagnetically shields the RF connection rod 920 and the middle RF distribution tube 922 from each other. In one embodiment, the inner shield 950, the RF connection rod 920 and the middle RF distribution tube 922 are coaxial. The inner shield 950 is separated from the RF connection rod 920 and from the middle RF distribution tube 922 by cylindrical gaps 921 and 923, respectively, that are sufficient to prevent electrical discharge or breakdown in the gaps 921 and 923.

An upper shield 955 is disposed between the middle RF distribution tube 922 and the shortened RF distribution cylinder 940 including a radial flange 955-1 at its top end. In one embodiment, the upper shield 955 is a hollow cylinder coaxial with the shortened RF distribution cylinder 940 and coaxial with the middle RF distribution tube 922, and surrounds the middle RF distribution tube 922. The upper shield 955 extends down to an opening 610a in the plenum plate 610. A skirt 957 extends radially out from a bottom edge 955a of the upper shield 955 and has a sufficient radius to overlie an edge of the opening 610a in the plenum plate 610, so as to cover a separation gap between the plenum plate 610 and the upper shield 955.

A middle cylindrical shield 960 extends axially from the plenum plate 610 and towards the ground plate 184. In an embodiment, the middle cylindrical shield 960 is coaxial with the shields 950 and 955. A lower cylindrical shield 965 extends downwardly from the ground plate 184 to a bottom edge 965a. A bottom shield 971 including a hollow truncated cone-shaped section, extends downwardly from the bottom edge 965a of the lower cylindrical shield 965 to a cylindrical base 972. The cylindrical base 972 encircles a floor 974 of the bottom shield 971.

Advantageous effects of various ones of the embodiments of FIGS. 22-36 include symmetrical distribution of RF power to the coil antennas for enhanced plasma distribution symmetry. For example, the RF feed structure of FIG. 22 has triangular symmetry, as defined with reference to FIGS. 22 and 24A. Shielding of the coils from asymmetrical features reduces skew effects in plasma distribution. Such shielding is provided in the embodiments of FIGS. 22-36 by the ground plate 184, the plenum plate 610 and the ceiling plate 655. Such shielding is further provided by the flanges 922c and 930c and the skirts 942 and 957, for example. The extra height afforded by the addition of the ceiling plate 900 above the top plate 655 and raising the RF power terminals to the ceiling plate 900 improves RF current distribution uniformity. It is believed that this added height increases the length of RF current travel through the RF feeds over which current distribution may equilibrate to increase uniformity. Shielding of the coil antenna feeds from one another enhances independent control of the coil antennas, for superior control of plasma density distribution.

While the foregoing is directed to embodiments of the present invention, other and further embodiments of the invention may be devised without departing from the basic scope thereof, and the scope thereof is determined by the claims that follow.

What is claimed is:
1. A plasma reactor comprising:
    a window assembly;
    concentric inner and outer coil antennas adjacent said window assembly;
    inner and outer current distributors each comprising an inverted bowl-shaped conductor coupled to said inner and outer coil antennas, respectively, and wherein said outer current distributor concentrically surrounds said inner current distributor, and wherein each inverted bowl-shaped conductor comprises an axially symmetric hollow body comprising a bottom edge facing and terminated at a supply end of the corresponding one of said inner and outer coil antennas;
    a ceiling plate overlying said window assembly and first and second RF power terminals at said ceiling plate;
    a plenum plate between said ceiling plate and said inner and outer current distributors, the plenum plate comprising a central opening, the central opening being coaxial with said inner and outer coil antennas;
    first and second axial RF power feeds connected at respective connections between respective ones of said first and second RF power terminals and respective ones of said inner and outer current distributors, wherein said first axial RF power feed coincides with an axis of symmetry of said coil antennas, the respective connection corresponding to said inner current distributor being located on said axis of symmetry, and wherein said second axial RF power feed extends downwardly through said central opening with a gap between said plenum plate and said second axial RF power feed, and said second axial RF power feed includes outwardly extending portions that project past an edge of said central opening and axially extending portions projecting downward from the outwardly extending portions to contact a top of the inverted bowl-shaped conductor of said outer current distributor.
2. The plasma reactor of claim 1 wherein said first axial RF power feed comprises a center RF connection rod, and wherein said center RF connection rod and said outer current distributor are coaxial.
3. The plasma reactor of claim 2 wherein said inner and outer coil antennas are coaxial with said center RF connection rod.
4. The plasma reactor of claim 2, wherein said second axial RF power feed comprises a distribution cylinder surrounding said center RF connection rod.
5. The plasma reactor of claim 4 further comprising plural spaced-apart reactance elements coupled to said distribution cylinder.
6. The plasma reactor of claim 5 wherein said reactance elements comprise discrete capacitors coupled between said distribution cylinder and said ceiling plate.
7. The plasma reactor of claim 4, wherein the outwardly extending portions extend from a bottom edge of said distribution cylinder.
8. The plasma reactor of claim 1 wherein the outwardly extending portions comprise a radial flange overlying said gap.
9. The plasma reactor of claim 1 wherein the outwardly extending portions comprise plural radial outer arms.

10. The plasma reactor of claim 1, comprising plural axial outer legs that connect the outwardly extending portions to said outer current distributor.

11. The plasma reactor of claim 10, comprising a ground plate between said plenum plate and said outer coil antenna.

12. The plasma reactor of claim 11, wherein said plural axial outer legs extend through said ground plate.

13. The plasma reactor of claim 1 wherein said outer coil antenna comprises a cylindrical side coil and wherein said window assembly comprises a disk-shaped window facing said inner coil antenna and a cylindrical side window facing said cylindrical side coil.

\* \* \* \* \*